United States Patent
Ding et al.

(10) Patent No.: US 10,903,291 B2
(45) Date of Patent: Jan. 26, 2021

(54) TERMINALS AND DISPLAY SCREENS

(71) Applicant: YUNGU (GU'AN) TECHNOLOGY CO., LTD., Langfang (CN)

(72) Inventors: Liwei Ding, Langfang (CN); Qi Shan, Langfang (CN); Yu Zhang, Langfang (CN); Fu Liao, Langfang (CN)

(*) Notice: Subject to any disclaimer, the term of this patent is extended or adjusted under 35 U.S.C. 154(b) by 0 days.

(21) Appl. No.: 16/556,193

(22) Filed: Aug. 29, 2019

(65) Prior Publication Data

US 2019/0393286 A1 Dec. 26, 2019

Related U.S. Application Data

(63) Continuation of application No. PCT/CN2018/089085, filed on May 30, 2018.

(30) Foreign Application Priority Data

Sep. 30, 2017 (CN) .......................... 2017 1 0923368
Feb. 9, 2018 (CN) .......................... 2018 1 0136191

(51) Int. Cl.
  *H01L 27/32* (2006.01)
  *G09G 3/3225* (2016.01)

(52) U.S. Cl.
  CPC ....... *H01L 27/3246* (2013.01); *G09G 3/3225* (2013.01); *H01L 27/3211* (2013.01); *H01L 27/3227* (2013.01); *H01L 27/3232* (2013.01); *H01L 27/3262* (2013.01); *G09G 2300/0426* (2013.01); *G09G 2300/0452* (2013.01)

(58) Field of Classification Search
  None
  See application file for complete search history.

(56) References Cited

U.S. PATENT DOCUMENTS

| 10,381,381 B1* | 8/2019 | Choi | H01L 27/1248 |
| 2006/0180890 A1* | 8/2006 | Naugler, Jr. | H01L 27/3269 |
| | | | 257/444 |
| 2017/0251137 A1* | 8/2017 | Evans, V | G02F 1/13318 |
| 2018/0211587 A1 | 7/2018 | Yu et al. | |
| 2018/0365466 A1* | 12/2018 | Shim | G06F 3/0421 |
| 2019/0188444 A1* | 6/2019 | Yang | G09G 3/3233 |

FOREIGN PATENT DOCUMENTS

| CN | 106601780 A | 4/2017 |
| CN | 106920470 A | 7/2017 |
| CN | 107124490 A | 9/2017 |

(Continued)

OTHER PUBLICATIONS

TW Office Action with Search report dated Apr. 12, 2019 in the corresponding TW application (application No. 107121946).
(Continued)

*Primary Examiner* — Joseph R Haley
(74) *Attorney, Agent, or Firm* — Kilpatrick Townsend & Stockton

(57) ABSTRACT

The present application relates to a terminal and a display screen. A display screen includes a display area including at least two display regions. The at least two display regions includes a first display region and a second display region. A total thickness of metal layers of the first display region is less than a total thickness of metal layers of the second display region.

19 Claims, 17 Drawing Sheets

(56) References Cited

FOREIGN PATENT DOCUMENTS

| | | | |
|---|---|---|---|
| CN | 107422466 | A | 12/2017 |
| EP | 2662849 | A2 | 11/2013 |
| TW | I222045 | B | 10/2004 |

OTHER PUBLICATIONS

CN First Office Action dated Apr. 17, 2019 in the corresponding CN application (application No. 201810136191.2).
International Search Report dated Sep. 7, 2018 in the corresponding PCT application (application No. PCT/CN2018/089085).

* cited by examiner

TERMINALS AND DISPLAY SCREENS

CROSS REFERENCE TO RELATED APPLICATIONS

This application is a continuation application of International Application PCT/CN2018/089085, filed on May 30, 2018, which claims the priority benefits of Chinese Patent Application No. 2017109233689, titled "TERMINAL AND DISPLAY SCREEN" and filed on Sep. 30, 2017, and Chinese Patent Application No. 2018101361912, titled "TERMINAL AND DISPLAY SCREEN" and filed on Feb. 9, 2018. The entireties of these applications are incorporated by reference herein for all purposes.

TECHNICAL FIELD

The present disclosure relates to the field of display technologies.

BACKGROUND

With rapid development of mobile electronic product industry and continuously updating of new product, a market thereof has higher and higher expectations for mobile display electronic products. For example, products such as mobile phones have developed from being with a border to being with a narrow border and no border. An absence of the border on a top side and a bottom side thereof directly affects placements of a front camera, a sensor, and a product identification. In order to realize a borderless or narrow border, conventional mobile display electronic device can be provided with a slot or a mounting hole on a display screen thereof to accommodate related components, or directly remove the related components. However, none of the aforementioned solutions can truly achieve a full screen display effect.

SUMMARY

Accordingly, it is necessary to provide a terminal and a display screen capable of achieving a full screen display effect.

A display screen includes: a display area including at least two display regions, the at least two display regions including a first display region having a plurality of first metal layers and a second display region having a plurality of second metal layers; and a total thickness of first metal layers of the first display region being less than a total thickness of second metal layers of the second display region.

In an embodiment, the total thickness of the first metal layers of the first display region is less than or equal to 10 to 80 percent of the total thickness of the second metal layers of the second display region.

In an embodiment, the display screen includes a first end and a second end opposite to the first end; the first display region is disposed at the first end of the display screen; and the second display region is connected to the first display region and is located at the second end of the display screen.

In an embodiment, a thickness of each first metal layer of the first display region is less than 10 to 80 percent of a thickness of the second metal layer in the second display region.

In an embodiment, a surface of each of the first metal layer of the first display region and the second metal layer of the second display region is provided with a transparent flat layer, respectively; and a sum of thicknesses of the first metal layers and thicknesses of the flat layers in the first display region is equal to a sum of thicknesses of the second metal layers and thicknesses of the flat layers in the second display region.

In an embodiment, the display screen includes: a substrate; a screen circuit layer formed on the substrate; the screen circuit layer including a first portion and a second portion formed on the first portion; a power transistor layer disposed on the screen circuit layer; the second portion of the screen circuit layer being coupled to the power transistor layer; an insulating layer disposed at a portion of the screen circuit layer uncoupled with the power transistor layer; and a light emitting module disposed on the power transistor layer; the light emitting module including an anode, a hole layer disposed on the anode, a light emitting layer disposed on the hole layer, an electron layer disposed on the light emitting layer, and a cathode layer disposed on the electron layer; the cathode layer extending from the electron layer to the insulating layer and continuously extending at an end of the insulating layer to be coupled to an external circuit. The metal layers include the screen circuit layer, the anode, and the cathode layer.

In an embodiment, the display screen further includes a conductive layer and a first-typed light emitting unit formed on the conductive layer, and the first typed light emitting unit includes a pixel region and electrochromic light transmittance material around the pixel region.

In an embodiment, the display screen further includes a second typed light emitting unit, the second typed light emitting unit includes a pixel region and a pixel defining layer formed around the pixel region, the pixel defining layer contains no electrochromic light transmittance material; a plurality of the first typed light emitting units are integrated into the first display region, and a plurality of second typed light emitting units are integrated into the second display region.

In an embodiment, the electrochromic light transmittance material is one of polyaniline, polythiophene, and polythiophene derivative, and the polythiophene derivative is 1,3-dimethyl polythiophene or 1,4-p-dimethyl polythiophene.

In an embodiment, the electrochromic light transmittance material is disposed in the pixel defining layer, penetrating the pixel defining layer and contacting with the conductive layer.

In an embodiment, the electrochromic light transmittance material forms a strip, and a ratio of a width of the strip to a width of the pixel defining layer ranges from 1:2 to 3:4.

In an embodiment, the width of the strip ranges from 4 μm to 10 μm.

In an embodiment, the screen circuit layer is provided with a pixel circuit and a driving circuit; the pixel circuit is distributed over the entire display area of the display screen; and the driving circuit is located below the pixel circuit and is disposed at both sides of the second display region.

In an embodiment, the second portion of the screen circuit layer is provided with a recess; and the insulating layer is further filled in the recess.

In an embodiment, an instantaneous blackening circuit is further included; the instantaneous blackening circuit is connected to the pixel circuit of the first display region; and the instantaneous blackening circuit is used to receive a control signal, and control each pixel in the first display region to be in a non-display state when receiving the control signal.

A terminal includes a body and a display screen disposed on the body; the body being used to implement a target function of the terminal; the display screen including a display area, which includes at least two display regions, the at least two display regions including a first display region having a plurality of first metal layers and a second display region having a plurality of second metal layers; a total thickness of first metal layers of the first display region being less than a total thickness of second metal layers of the second display region; and the body including a controller and a front device; the front device being disposed under the first display region of the display screen; the controller controlling the first display region and the second display region independently; and the controller being further used to control the first display region to be in an unlit state when the front device is in operation.

In an embodiment, the controller includes a partition control module or called as a partition control circuit; the partition control module is used to receive an operating signal of the front device, and generate a control signal for the first display region when receiving the operating signal; and the control signal is used to control each pixel of the first display region to be in a non-display state.

In an embodiment, the first display region comprises a pixel circuit, the pixel circuit of the first display region is an N-type circuit, and the control signal is a low-level signal; or the pixel circuit of the first display region is a P-type circuit, and the control signal is a high-level signal.

In an embodiment, the terminal further includes an under-screen photosensitive module, and the under-screen photosensitive module is at least one of a photoelectric sensor and a camera.

According to the aforementioned terminal and display screen, the display screen includes at least a first display region and a second display region, and the total thickness of metal layers of the first display region is provided to be less than the total thickness of metal layers of the second display region, so that the first display region is in a transparent state during an unlit state. Therefore, when the terminal adopts the aforementioned display screen, a front device such as a front camera or the like can be disposed under the first display region. When the front camera is required to be used, the first display region is merely required to be unlit, and when the front camera is not working, each display region in the display screen can be normally displayed, thereby achieving a full screen display effect.

DETAILED DESCRIPTION OF THE EMBODIMENTS

In order to make the objects, features and advantages of the present disclosure more apparent, the present application will be described in detail with reference to the accompanying drawings and the embodiments below. The specific embodiments described herein are merely configured to explain the present application, and are not intended to limit the present application.

Figure 1:
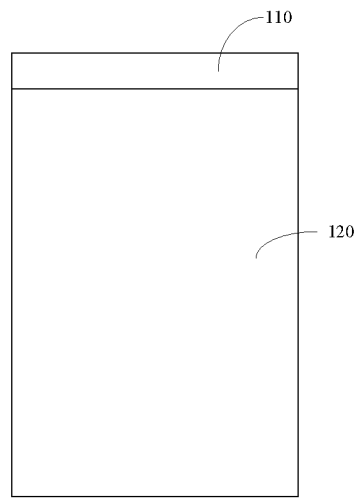
FIG. 1 is a schematic view of a screen structure of a display screen in accordance with an embodiment.

In an embodiment, FIG. 1 is a schematic diagram of a screen structure of a display screen in an embodiment. The display screen can be applied to various terminals to meet user's requirements for a full screen display effect of the terminals. The terminal can be a device such as a mobile phone, a tablet, a palmtop computer, or a computer.

Figure 2:
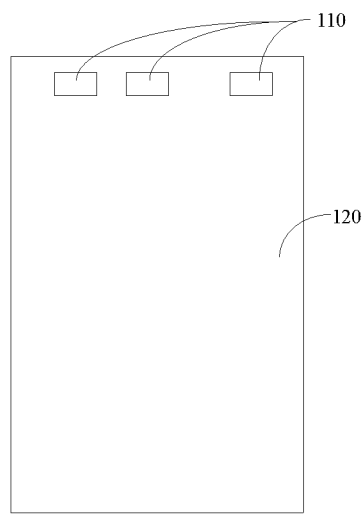
FIG. 2 is a schematic view of a screen structure of a display screen in accordance with another embodiment.

In this embodiment, the display screen includes a display area. The display area includes two display regions. The two display regions are a first display region 110 having a plurality of first metal layers and a second display region 120 having a plurality of second metal layers, respectively. The first display region 110 and the second display region 120 together form an entire display area of the display screen. Specifically, the entire display area formed by the first display region 110 and the second display region 120 is also the screen area of the display screen, so that the display screen can truly achieve the full screen display effect. In this embodiment, the first display region 110 and the second display region 120 are opposite to each other at both ends of the display screen. That is, the display screen includes a first end and a second end opposite to the first end, and the first display region 110 is disposed at the first end of the display screen and the second display region 120 is disposed at the second end of the display screen. The first display region 110 and the second display region 120 are disposed along a length direction of the terminal. In other embodiments, the first display region 110 and the second display region 120 can also be disposed along a width direction of the terminal. In an embodiment, the first display region 110 can also be surrounded by the second display region 120. A position of the first display region 110 on the display screen can be determined according to a position of a front device in the terminal. In the present disclosure, the front device refers to a device that is required to be installed on the display screen side of the terminal, that is, the device on the same side of a traditional terminal as the display screen. The front device can be a front camera, a light sensitive device (or a photosensitive device) or a product identification displayed on demand. When a plurality of front devices are collectively disposed in one region, the first display region 110 can be one; when a plurality of front devices are dispersedly disposed in a plurality of regions, a plurality of first display regions 110 can be correspondingly disposed, such that each first display region 110 corresponds to one or more front devices, as shown in FIG. 2. A total thickness of first metal layers in the first display region 110 is less than a total thickness of second metal layers in the second display region 120. Specifically, a thickness of the first display region 110 is less than or equal to a thickness corresponding to the first display region 110 in a transparent state during an unlit state.

The display screen includes at least the first display region 110 and the second display region 120, the total thickness of the first metal layers of the first display region 110 is provided to be less than the total thickness of the second metal layers in the second display region 120, and the thickness of the first display region 110 is less than or equal to the thickness corresponding to the first display region 110 in the transparent state during the unlit state, so that the first display region 110 is in the transparent state during the unlit state. Therefore, when the terminal adopts the aforementioned display screen, a front device such as a front camera or the like can be disposed under the first display region 110. When it is required to use the front camera, it is only necessary to control the first display region 110 to be unlit, and when the front camera is not working, each display region in the display screen can be normally displayed, thereby achieving a full screen display effect.

In an embodiment, the total thickness of the first metal layers in the first display region 110 is less than or equal to 10 to 80 percent of the total thickness of the second metal layers of the second display region 120, thereby ensuring that the first display with thinned first metal layers is in a transparent state during the unlit state. In the present embodiment, the first display region 110 is disposed at a position of an end edge of the display screen, so that even if trace impedance is increased due to that the metal layers of the display region are thinned, a display effect of the first display region 110 will not be affected.

In an embodiment, during a process of thinning the first metal layers in the first display region 110, each first metal layer in the first display region is correspondingly thinning treated, thereby ensuring that each first metal layer can work normally. That is, a thickness of each first metal layer in the first display region 110 is 10 to 80 percent of a thickness of the second metal layer in the second display region 120. Optionally, the thickness of each first metal layer in the first display region 110 is thinned by the same ratio with respect to the thickness of the corresponding second metal layer in the second display region 120.

In an embodiment, a transparent flat layer is formed on each metal layer in the display screen. The flat layer can be formed by being filled with a transparent insulating material. Therefore, a sum of thicknesses of the first metal layers and the thicknesses of the connected flat layers in the first display region 110 is equal to a sum of thicknesses of the second metal layers and the connected flat layers in the second display region 120, so that the entire display screen has a good flatness. That is, the first metal layer of the first display region 110 has a relatively smaller thickness with respect to the second metal layer in the second display region 120, and the flat layer in contact with the thinned first metal layer in the first display region 110 has a relatively greater thickness with respect to the same flat layer in the second display region 120, such that the total thickness of the first display region 110 and the total thickness of the second display region 120 are the same.

Figure 3:
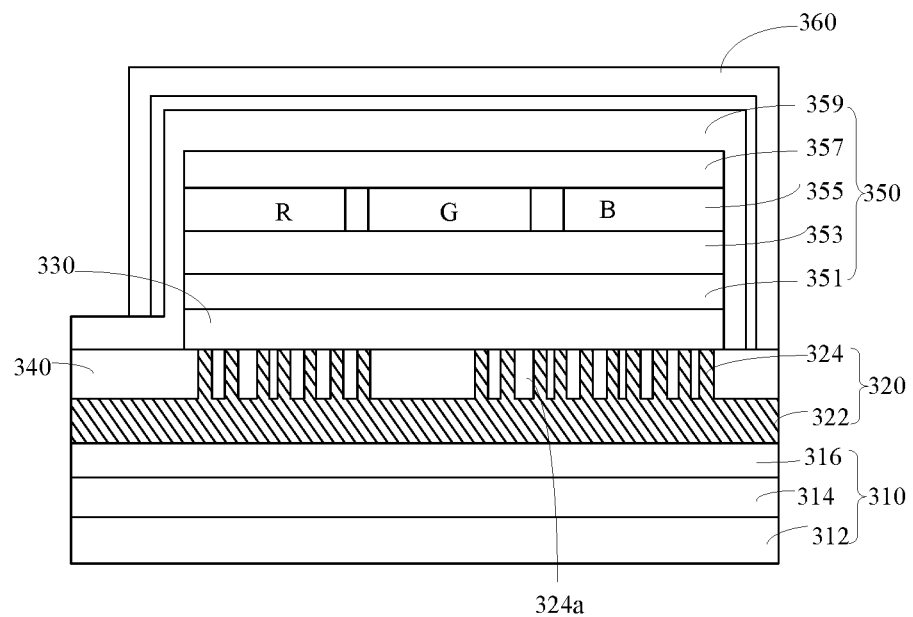
FIG. 3 is a cross-sectional view of the display screen in accordance with an embodiment.

In an embodiment, the display screen further includes an instantaneous blackening circuit. The instantaneous blackening circuit is connected to a pixel circuit of the first display region 110. The instantaneous blackening circuit is used to receive the control signal and control each pixel of the first display region 110 to be in a non-display state upon receiving the control signal. The control signal can be sent by a device such as a controller on the terminal where the display screen is located. For example, when the controller in the terminal detects that the front device (such as the front camera and the photoelectric sensor, etc.) under the first display region 110 is working, the control signal is generated and output to the instantaneous blackening circuit. The instantaneous blackening circuit controls each pixel of the first display region 110 of the display screen to be in a non-display state after receiving the control signal. Specifically, if the first display region 110 of the display screen is in a display state, the instantaneous blackening circuit controls each pixel of the first display region 110 to be turned off, that is, instantaneously blackened, so that the first display region 110 is in a non-display state. Since the first display region 110 is in the transparent state during the non-display state (i.e., an unlit state), so that light can normally enter corresponding front device through the first display region, thereby ensuring that the front device can normally work. If the first display region 110 of the display screen is in the non-display state, that is, the unlit state, the instantaneous blackening circuit controls the first display region 110 to remain in the non-display state. In this embodiment, the instantaneous blackening circuit is in a standby state until receiving the control signal, and does not work, thus the instantaneous blackening circuit does not affect normal display of each display region of the display screen. The instantaneous blackening circuit enters an operating state when receiving the control signal, thereby realizing control the display of the first display region 110 without affecting the normal display of other display region. FIG. 3 is a cross-sectional view of the display screen according to an embodiment. Referring to FIG. 3, the display screen includes a substrate 310, a screen circuit layer 320, a power transistor layer 330, an insulating layer 340, and a light emitting module 350.

The substrate 310 includes a base 312, an adhesive layer (PI) 314 disposed on the base 312, and a buffer layer (BL) 316 disposed on the adhesive layer 314. The base 312 can be a glass substrate (Glass), a plastic substrate, or a stainless steel substrate.

The screen circuit layer 320 is disposed on the buffer layer 316 of the substrate 310. The screen circuit layer 320 includes a first portion 322 and a second portion 324 formed on the first portion 322. The power transistor layer 330 is disposed above the screen circuit layer 320 and connected to the second portion 324 of the screen circuit 320. In the present embodiment, the power transistor layer 330 is a thin film transistor (TFT) layer. The insulating layer 340 is filled in an unconnected area of the screen circuit layer 320 and the power transistor layer 330. The light emitting module 350 is disposed on the power transistor layer 330.

In the present embodiment, the screen circuit layer 320 and the power transistor layer 330 are disposed between the light emitting module 350 and the substrate 310, that is, the screen circuit layer 320 and the power transistor layer 330 are designed as a top and bottom three-dimensional structure instead of being disposed around the light emitting module by conventional means as a tiling structure, thereby avoiding presence of a border to achieve a borderless display screen, and further ensuring that the display screen can achieve a full screen display effect. In the present embodiment, the second portion 324 of the screen circuit layer 320 is provided with a plurality of grooves 324a. The plurality of grooves 324a are uniformly distributed so that widths of the second portion 324 between each groove 324a are uniform and small, thus it is more advantageous for various circuits in the screen circuit layer 320 connecting to the power transistor layer 320. In addition, by providing the plurality of grooves 324a in the second portion 324, it is advantageous to increase transmittance of the entire display screen.

The light emitting module 350 includes an anode 351, a hole layer 353 disposed on the anode 351, a light emitting layer 355 disposed on the hole layer 353, an electron layer 357 disposed on the light emitting layer 355, and a cathode layer 359 disposed on the electron layer 357. The cathode layer 359 extends from the electron layer 357 to the insulating layer 340 and continuously extends at an end of the insulating layer 340 to be connected to an external circuit. That is, in the present embodiment, the metal layers in the display screen includes layer structures such as the screen circuit layer 320, the anode 351, and the cathode layer 359 including metal wires. The light-emitting layer 355 includes three kinds of light-emitting units of red R, green B, and blue B which are evenly arranged. The lighting module 350 can be implemented in a conventional design.

In the present embodiment, an encapsulation layer 360 is formed on the light emitting module 350 to cover the light emitting module 350. The encapsulation layer 360, the insulating layer 340, and the cathode 359 form a cladding space to clad the power transistor layer 330 and the light emitting module 350.

Figure 4:
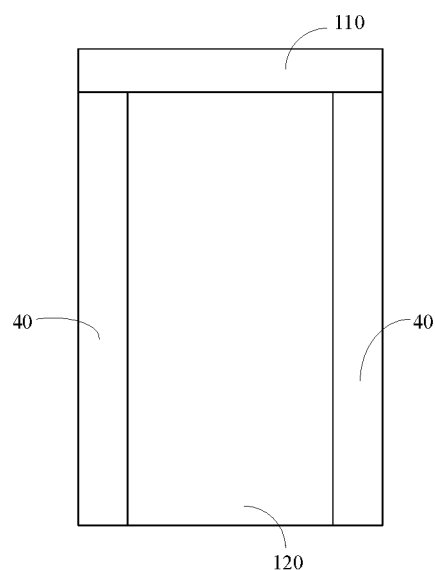
FIG. 4 is a schematic diagram of a position of a driving circuit in the display screen in accordance with an embodiment.

In an embodiment, the screen circuit layer 320 is provided with a pixel circuit and a driving circuit. The pixel circuit is distributed over the entire display area of the display screen. The driving circuit 40 is located under the pixel circuit and disposed at both sides of the second display region 120, as shown in FIG. 4. The position of driving circuit 40 located is shown in FIG. 4. An area of the region where the drive circuit 40 is located can be set as needed. By integrating the drive circuit 40 on the screen circuit layer 320 of the display screen, the presence of the border can be avoided, thereby ensuring that the display screen can achieve a full screen display effect.

The aforementioned display screen is not limited to be applied to the terminal with the front device, but can also be applied to other terminals without the front device, that is, the aforementioned display screen can be applied to any type of terminal.

A terminal is further provided in an embodiment of the present application. The terminal includes a body and a display screen disposed on the body. The body is used to implement targets or expected functions of the terminal. The display screen can be the display screen of any of the foregoing embodiments. The body includes a controller and a front device. In this embodiment, a front camera is taken as an example of the front device for description.

The front camera is disposed under the first display region. The controller is used to monitor the operating state of the front camera and control the first display region to be unlit when monitoring that the front camera is working. When the first display region is in the unlit state, the first display region will exhibit a transparent state, so that the normal operation of the front camera will not be affected. The other display regions of the display screen are independently controlled by the controller and are not affected by the operating state of the front camera. That is, when the front camera is not working, the controller controls the first display region and the second display region, so that the first display region and the second display region are displayed as needed, thereby realizing the full screen display effect. When the front camera is working, the controller controls the first display region to be unlit, that is, the region is not displayed, so that the front camera is visible, which does not affect the normal operation of the front camera, other display regions are controlled by the controller independently, and the display processes thereof will not be affected. In the aforementioned terminal, when the terminal is in a sleep state, a standby state, or a power off state, that is, when the display screen is unlit, the front camera is also in a visible state.

Figure 5:
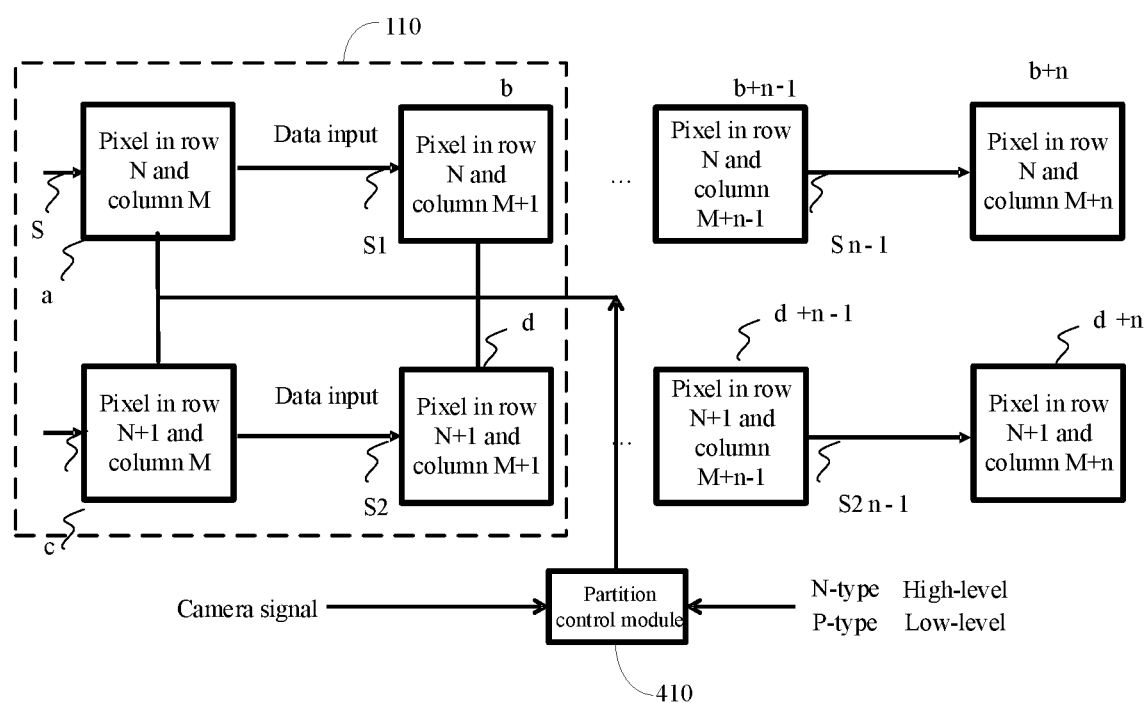
FIG. 5 is a schematic diagram illustrating driving a terminal in accordance with an embodiment.

FIG. 5 is a schematic diagram of driving the terminal in an embodiment. In this embodiment, the controller includes a partition control module 410. The partition control module is used to receive an operation signal (camera signal) of the front camera, and the partition control module outputs a control signal to control each pixel of the first display region 110 to be instantaneously blackened (i.e. in the unlit status) upon receiving the operation signal. The controller monitors the operating state of the front camera, operates when the controller monitors that the front camera is working, the controller outputs the operation signal. Corresponding monitoring components can be provided to monitor the operating state of the front camera, and the operation signal can also be output when the corresponding monitoring components monitor that the front camera is in the operating state. The control signal output by the partition control module 410 is a level signal, and whether the level signal is in a high-level or a low-level is determined according to the type of the pixel circuit. When the pixel circuit is an N-type circuit (that is, an N-type thin film transistor is used), the control signal is a low-level signal, and when the pixel circuit is a P-type circuit (that is, a P-type thin film transistor is used), the control signal is high-level signal.

In the aforementioned terminal, when the camera is not in use, the screen is normally displayed, and the partition control module 410 is in a standby state and does not work. The first display region 110 above the camera and other display regions are unaffected and can work normally. When the camera is activated, the partition control module 410 directly transmits a corresponding control signal (the high-level control signal or the low-level control signal) to the pixel in the region above the camera (that is, each pixel in the first display region 110 to turn off each pixel in the first display region 110 (that is, to instantaneously blacken each pixel of the first display region 110) upon receiving the operating signal of the camera, and other display regions will not be affected, and will still be displayed normally.

Figure 6:
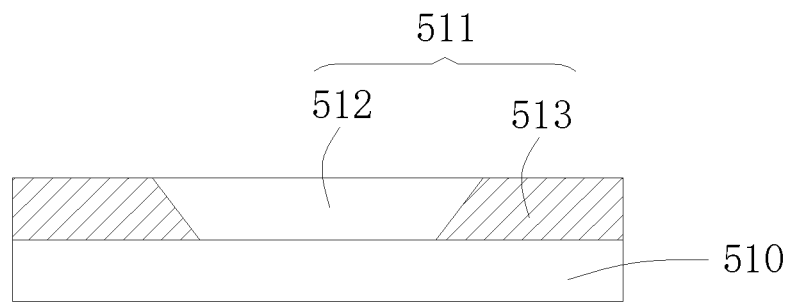
FIG. 6 is a schematic diagram illustrating a first display region of the display screen in accordance with an embodiment.
Figure 7:
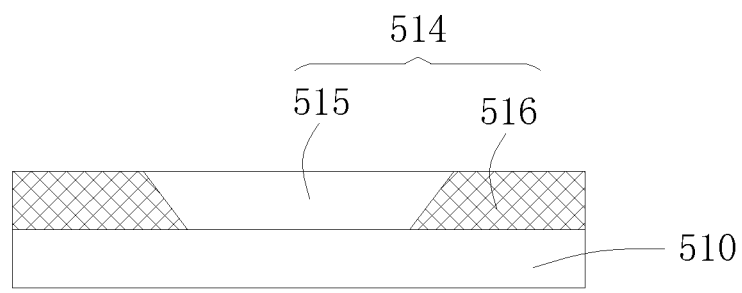
FIG. 7 is a schematic diagram illustrating a second display region of the display screen.
Figure 8:
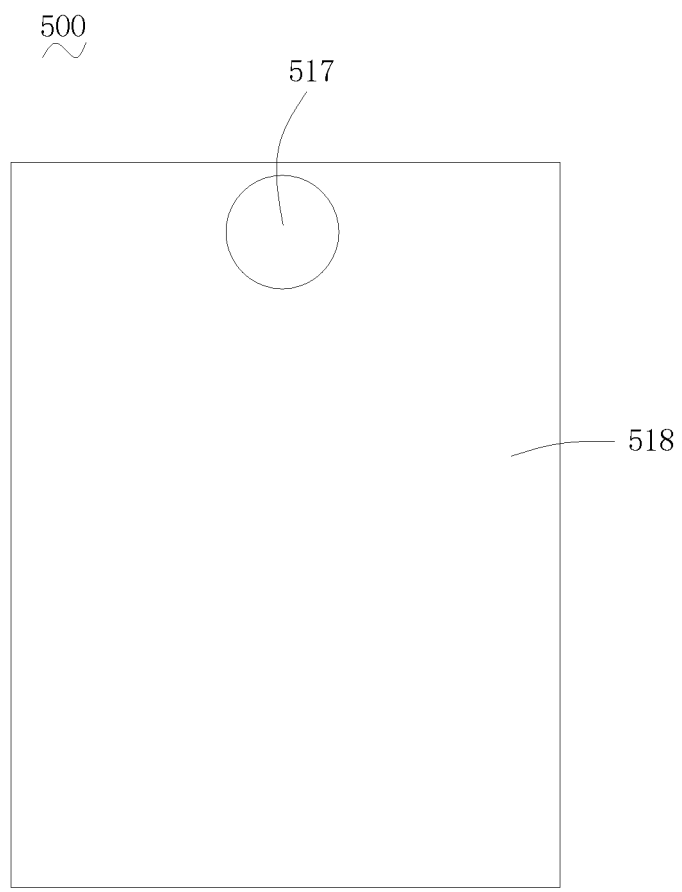
FIG. 8 is a schematic diagram of a display screen in accordance with an embodiment.

In an embodiment, referring to FIGS. 6 to 8, a display screen 500 according to an embodiment includes a conductive layer 510 and a first typed light emitting unit 511 formed on the conductive layer 510. The first typed light emitting unit 511 includes a pixel region 512 and an electrochromic light transmittance material 513 around the pixel region 512. The electrochromic light transmittance material 513 exhibits light absorbing property when it is energized, and the electrochromic light transmittance material 513 exhibits light transmittance when it is unenergized.

On the basis of the foregoing embodiments, the display screen 500 further includes a second typed light emitting unit 514, and the second typed light emitting unit 514 includes a pixel region 515 and a pixel defining layer 516 formed around the pixel region 515. The pixel defining layer 516 does not contain electrochromic light transmittance material 513. A plurality of the first typed light emitting units 511 are integrated into the first display region 517, and a plurality of the second typed light emitting units 514 are integrated into the second display region 518.

Since the first typed light-emitting unit 511 has the electrochromic light transmittance material 513, when the conductive layer 510 is energized, the pixel region 512 of the first typed light emitting unit 511 is caused to emit light, and the electrochromic light transmittance material 513 exhibits light absorbing property to reduce an influence of ambient light, so that pictures can be displayed normally. In this way, a polarizer is not required to be used in the first display region 517 of the display screen 500, so as to achieve an improved display 500.

Since the first display region 517 of the display screen 500 of the forgoing embodiment includes the electrochromic light transmittance material 513, when the conductive layer 510 is energized, pictures can be displayed normally in the first display region 517; and when the conductive layer 510 is unenergized, the pixel region 512 of the first typed light emitting unit 511 does not emit light, and the electrochromic light transmittance material 513 exhibits transparent property, whereby the first display region 517 becomes nearly transparent, and the ambient light can smoothly pass through the first display region 517 of the display screen 500. In this way, the front camera can be disposed behind the display screen 500 and be aligned with the first display region 517, so that when the front camera is used, the front camera can be used to image as long as the conductive layer 510 of the first display region 517 is not energized. It can be seen that the display screen 500 according to the present embodiment is not required to reserve a position for the front camera, and even eliminates the non-display area of the display screen in the prior art, thereby enlarging the screen ratio and optimizing the use experience.

On the basis of the foregoing embodiments, no polarizer is disposed above the first display region 517. Thus, when the front camera is used, the ambient light that is irradiated into the front camera can be further enhanced, and an image quality thereof can be further improved.

On the basis of the foregoing embodiments, the electrochromic light transmittance material 513 is one of polyaniline, polythiophene, and polythiophene derivatives. On the one hand, when the conductive layer 510 is energized, the electrochromic light transmittance materials 513 of polyaniline, polythiophene, and polythiophene derivatives exhibit light absorbing property, thereby reducing the influence of external light; when the conductive layer 510 is unenergized, the electrochromic light transmittance materials 513 of polyaniline, polythiophene, and polythiophene derivatives exhibit transparent property, and transmittance of these materials is large, so that the first display region 517 is nearly transparent, and the ambient light can pass therethrough smoothly, and the camera can image normally. On the other hand, the polyaniline, the polythiophene, and the polythiophene derivatives are all organic materials, and are disposed outside the pixel region 512 of the first typed light emitting unit 511 to protect the pixel region 512 of the first typed light emitting unit 511, and the above organic materials have certain flexibility and can be well fitted to the pixel region 512.

On the basis of the foregoing embodiments, the polythiophene derivative is 1,3-dimethyl polythiophene or 1,4-p-dimethyl polythiophene. When the conductive layer 510 is energized or unenergized, transmittance of the two polythiophene derivatives can be rapidly and stably changed under an action of an applied electric field, so that the first display region 517 of the display screen 500 can be switched quickly between a display state and a transparent state.

On the basis of the foregoing embodiments, the electrochromic light transmittance material 513 is disposed in close proximity to the pixel region 512. In this way, a space of the first display region 517 of the display screen 500 can be fully utilized. When the conductive layer 510 is energized, the pixel region 512 emits light, so that the first display region 517 can display the picture normally; and when the conductive layer 510 is unenergized, the electrochromic light transmittance material 513 is nearly transparent and the pixel region 512 is nearly transparent as well, so that the first display region 517 becomes nearly transparent, and the ambient light can smoothly pass through the first display region 517.

On the basis of the foregoing embodiments, the electrochromic light transmittance material 513 forms the pixel defining layer of the first typed light emitting unit 511. That is, the electrochromic light transmittance material 513 is used to replace the pixel defining layer of the first typed light emitting unit 511. Thus, the electrochromic light transmittance material 513 functions to define the pixel region 512 of the first typed light emitting unit 511 while performing the afore-described functions.

On the basis of the foregoing embodiments, a side surface of the pixel defining layer of the first typed light emitting unit 511 adjacent to the pixel region 512 is an inclined surface gradually facing away from the pixel region 512 along a direction away from the conductive layer 510, as shown in FIG. 6. A purpose thereof is to prevent light emitted by OLED from being absorbed in a large amount.

Preferably, the pixel defining layer of the first typed light emitting unit 511 has a thickness ranging from 4 μm to 8 μm. The purpose thereof is to prevent the light emitted by the OLED from being absorbed in a large amount.

Figure 9:
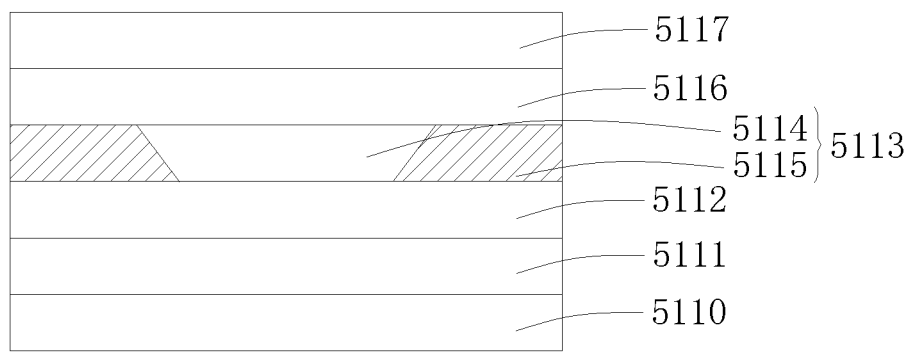
FIG. 9 is side view of the first display region in accordance with another embodiment, when the display screen is energized.

Referring to FIG. 9, in the first display region, a display screen 519 according to another embodiment includes a wiring layer 5110, a planarization layer 5111, an anode 5112, a first typed light emitting unit 5113, a cathode 5116, and a thin film encapsulation layer (TFE) 5117 which are sequentially stacked.

The first typed light emitting unit 5113 includes a pixel region 5114 and an electrochromic light transmittance material 5115 around the pixel region 5114.

Figure 10:
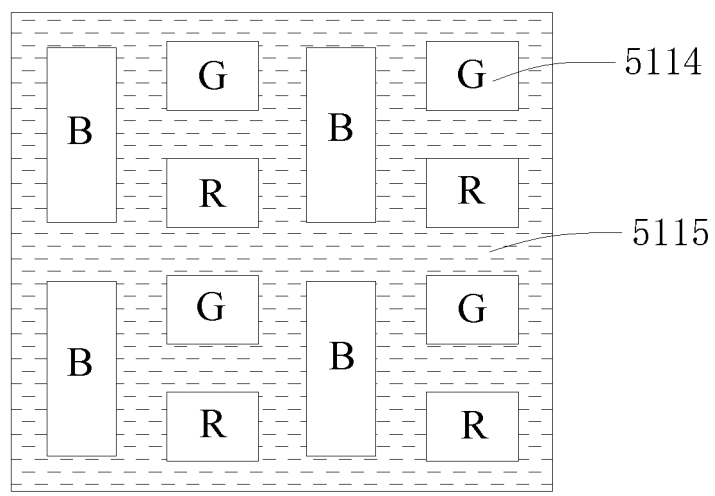
FIG. 10 is a top view of the first display region in accordance with another embodiment, when the display screen is energized.

Referring to FIG. 10 together, when the first typed light emitting unit 5113 is energized, the pixel region 5114 of the first typed light emitting unit 5113 can emit light, and the display screen 500 is illuminated. At the same time, the electrochromic light transmittance material 5115 exhibits light absorbing property, and the light transmittance of the electrochromic light transmittance material 5115 is less than 10%, which can reduce the influence of ambient light, so that the image can be normally displayed.

Figure 11:
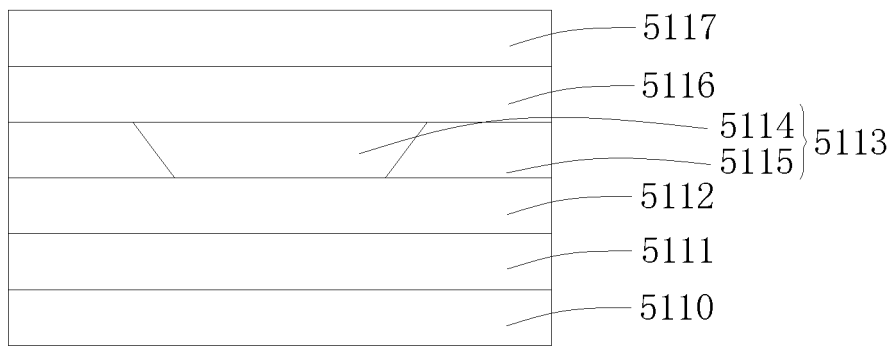
FIG. 11 is a side view of the first display region in accordance with another embodiment, when the display screen is not energized.
Figure 12:
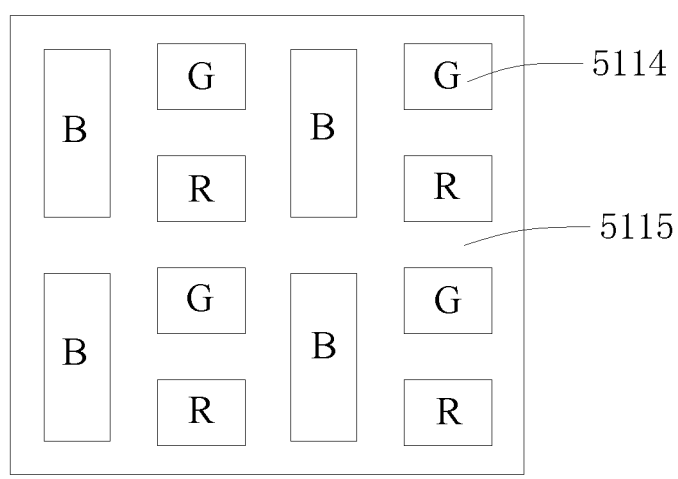
FIG. 12 is a top view of the first display region in accordance with another embodiment, when the display screen is not energized.

Referring to FIG. 11 and FIG. 12 together, when the first typed light emitting unit 5113 is unenergized, the electrochromic light transmittance material 5115 exhibits light transparent property. At this time, the light transmittance of the electrochromic light transmittance material 5115 is greater than 90%. Therefore, the ambient light can smoothly pass through the first display region 517 of display screen 519.

Figure 13:
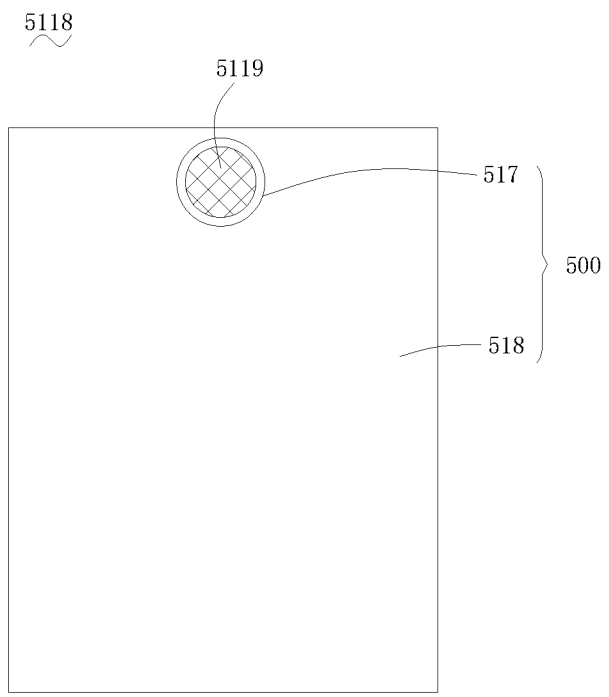
FIG. 13 is a schematic diagram of an electronic device in accordance with an embodiment.

Referring to FIG. 13 together, an electronic device 5118 according to an embodiment includes the display screen 500 according to the forgoing embodiments and an under-screen photosensitive module 5119.

Referring to FIGS. 6 to 8 together, the display screen 500 according to the forgoing embodiments includes a conductive layer 510 and a first typed light emitting unit 511 formed on the conductive layer 510. The first typed light emitting unit 511 includes a pixel region 512 and an electrochromic light transmittance material 513 around the pixel region 512. The electrochromic light transmittance material 513 exhibits light absorbing property when the electrochromic light transmittance material 513 is energized, and the electrochromic light transmittance material 513 exhibits light transparent property when the electrochromic light transmittance material 513 is unenergized.

The under-screen photosensitive module 5119 can sense the light that is incident through the display screen 500.

In the electronic device 5118 of the present application, since the first typed light emitting unit 511 of the display screen 500 has the electrochromic light transmittance material 513, when the conductive layer 510 is energized, the pixel region 512 of the first typed light emitting unit 511 is caused to emit light, the electrochromic light transmittance material 513 exhibits light absorbing property to reduce the influence of ambient light, so that the images can be displayed normally. Thus, the polarizer can be omitted from the display screen 500 of the electronic device 5118, thereby improving the display screen 500.

On the basis of the foregoing embodiments, the under-screen photosensitive module 5119 is at least one of a photoelectric sensor and a camera.

In the electronic device 5118 of the present application, since the first display region 517 of the display screen 500 contains the electrochromic light transmittance material 513, when the conductive layer 510 is energized, the images can be normally displayed in the first display region 517; when the layer 510 is unenergized, the pixel region 512 of the first typed light emitting unit 511 does not emit light, and the electrochromic light transmittance material 513 is transparent, whereby the first display region 517 becomes nearly transparent, so that the ambient light can pass through the first display region 517 of the display screen 500 smoothly. In this way, the under-screen photosensitive module 5119 of at least one of the photoelectric sensor and the camera can be disposed behind the display screen 500 and be aligned with the first display region 517. The display screen 500 according to the present application is not required to reserve a position for the afore-mentioned under-screen photosensitive module 5119, and even eliminates the non-display area of the display screen 500 in the prior art, thereby enlarging the screen ratio and optimizing the use experience.

Figure 14:
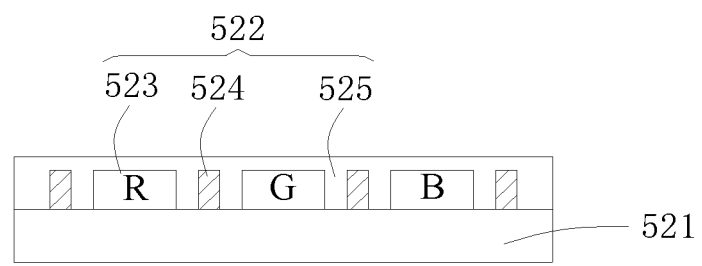
FIG. 14 is a side view of the display screen in the first display region in accordance with an embodiment.
Figure 15:
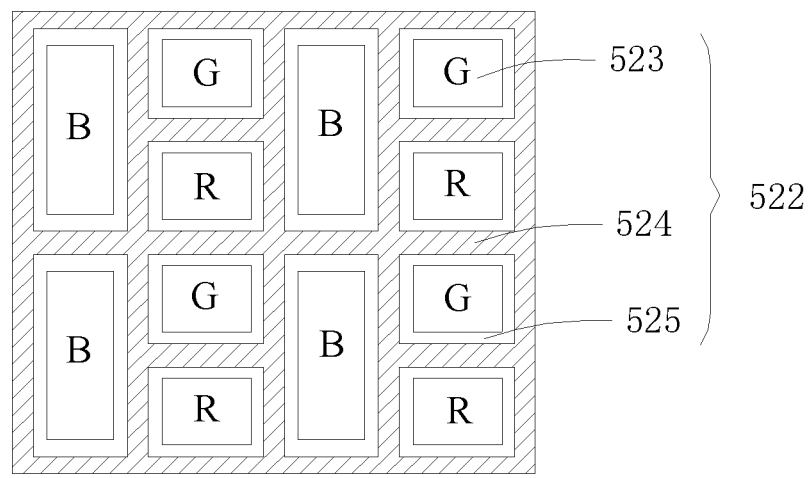
FIG. 15 is a top view of the display screen in the first display region in accordance with an embodiment.
Figure 16:
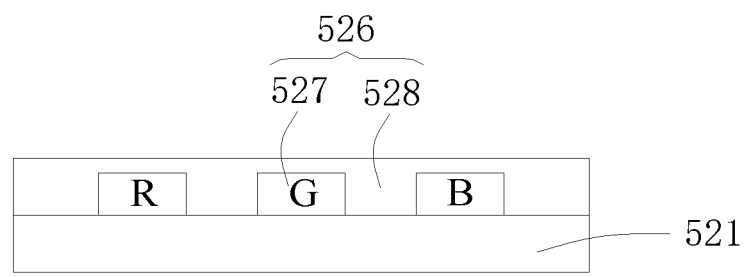
FIG. 16 is a side view of the display screen in the second display region in accordance with an embodiment.

In an embodiment, referring to FIGS. 14 to 16, the display screen 500 according to an embodiment includes a conductive layer 521 and a first typed light emitting unit 522 formed on the conductive layer 521. The first typed light emitting unit 522 includes a pixel region 523, an electrochromic light transmittance material 524 around the pixel region 523 and a pixel defining layer 525. The electrochromic light transmittance material 524 exhibits light absorbing property when the electrochromic light transmittance material 524 is energized, and the electrochromic light transmittance material 524 exhibits light transparent property when the electrochromic light transmittance material 524 is unenergized.

Since the first typed light emitting unit 522 has the electrochromic light transmittance material 524, when the conductive layer 521 is energized, the pixel region 523 of the first typed light emitting unit 522 is caused to emit light, and the electrochromic light transmittance material 524 exhibits light absorbing property to reduce the influence of ambient light, so that the images can be displayed normally. In this way, the polarizer is not required to be used in the display screen 500, thereby improving the display screen 500.

On the basis of the foregoing embodiments, a pixel defining layer 525 is formed around the pixel region 523, and the electrochromic light transmittance material 524 is disposed penetrating the pixel defining layer 525 and is in contact with the conductive layer 521. The purpose of this arrangement is that when the conductive layer 521 is energized or unenergized, the current can be conducted from the conductive layer 521 to the electrochromic light transmittance material 524 or the current can be cut off, thereby controlling the light transmittance of the electrochromic light transmittance material 524.

On the basis of the foregoing embodiments, the electrochromic light transmittance material 524 is disposed between the pixel defining layer 525 and the pixel region 523, as shown in FIG. 15. The purpose of such an arrangement is to distribute the electrochromic light transmittance material 524 more uniformly, so that when the conductive layer 521 is energized, the uniformly distributed electrochromic light transmittance material 524 causes the pixel region 523 of the first typed light emitting unit 522 to emit light uniformly, which is beneficial to improve a display effect of the display screen; and when the conductive layer 521 is unenergized, the uniformly distributed electrochromic light transmittance material 524 causes the ambient light to uniformly pass through a region of the display screen 500 where the electrochromic light transmittance material 524 is distributed.

On the basis of the foregoing embodiments, the electrochromic light transmittance material 524 forms a strip, and a ratio of a width of the strip to a width of the pixel defining layer 525 ranges from 1:2 and 3:4. In the afore-mentioned range of the ratio of the widths, the display effect of the displayed image can be improved when the conductive layer 521 is energized; and at the same time, the ambient light can uniformly pass through the strip on the display screen 500 when the conductive layer 521 is unenergized.

On the basis of the foregoing embodiments, the width of the strip ranges from 4 μm and 10 μm. On the one hand, when the conductive layer 521 is energized, it is sufficient to ensure the display effect of the displayed image; and when the conductive layer 521 is unenergized, it is sufficient to ensure a transmission effect of the ambient light. On the other hand, a manufacturing process of the strip having a width ranging from 4 μm and 10 μm is simple, which can avoid damage to the pixel region 523 during the manufacturing process.

On the basis of the foregoing embodiments, the electrochromic light transmittance material 524 is one of polyaniline, polythiophene, and polythiophene derivatives, or one of tungsten oxide, titanium oxide, and nickel oxide.

Preferably, the polythiophene derivative is 1,3-dimethyl polythiophene or 1,4-p-dimethyl polythiophene.

For organic electrochromic light transmittance materials such as polyaniline, polythiophene, and polythiophene derivatives, on the one hand, when the conductive layer 521 is energized, the electrochromic light transmittance materials of polyaniline, polythiophene, and polythiophene derivatives exhibit light absorbing property to reduce the influence of external light; when the conductive layer 521 is unenergized, the electrochromic light transmittance materials of polyaniline, polythiophene and polythiophene derivatives exhibit light transparent property, and the transmittance of these materials is large, so that the region where these materials are located are nearly transparent, the ambient light can smoothly pass therethrough, and the camera can image normally; on the other hand, the polyaniline, the polythiophene, and the polythiophene derivatives are all organic materials, and are disposed outside the pixel region 523 of the first typed light emitting unit 522 to protect the pixel region 523 of the first typed light emitting unit 522, and have certain flexibility so as to be well fitted to the pixel region 523.

The polythiophene derivative is preferably 1,3-dimethyl polythiophene or 1,4-p-dimethyl polythiophene. When the conductive layer 521 is energized or unenergized, the transmittance of the two polythiophene derivatives can be rapidly and stably changed under the action of an applied electric field, so that the display screen 500 can be quickly switched between a display state and a transparent state. At the same time, it has advantages such as low cost, good optical quality, good cycle reversibility, etc.

The inorganic electrochromic light transmittance materials such as tungsten oxide, titanium oxide, and nickel oxide have advantages of high coloring efficiency, good reversibility, short response time, long lifetime, low cost, etc., and are beneficial to be applied in the display screen 500 of the present application.

On the basis of the foregoing embodiments, referring to FIG. 8 together, the display screen 500 further includes a second typed light emitting unit 526, and the second typed light emitting unit 526 includes a pixel region 527 and a pixel defining layer 528 formed around the pixel region 527, and includes no electrochromic light transmittance material. A plurality of the first typed light emitting units 522 are integrated into the first display region 517, and a plurality of the second-type light-emitting units 526 are integrated into the second display region 518.

Since the first display region 517 of the display screen 500 of the forgoing embodiments includes the electrochromic light transmittance material 524, when the conductive layer 521 is energized, the images can be normally displayed in first display region 517; and when the conductive layer 521 is unenergized, the pixel region 527 of the first typed light emitting unit 522 does not emit light, and the electrochromic light transmittance material 524 is transparent, whereby the first display region 517 becomes nearly transparent, and the ambient light can smoothly pass through the first display region 517 of the display screen 500. Thus, the front camera can be disposed behind the display screen 500 and be aligned with the first display region 517. Therefore, when the front camera is in use, the front camera can be used to image as long as the conductive layer 521 of the first display region 517 is unenergized. The display screen 500 according to the present embodiment is not required to reserve a position for the front camera, and even eliminates the non-display area of the display screen, thereby enlarging the screen ratio and optimizing the use experience.

On the basis of the foregoing embodiment, no polarizer is disposed above the first display region 517. Thus, when the front camera is used, the ambient light that is irradiated into the front camera can be further enhanced, and the image quality thereof can be further improved.

Figure 17:
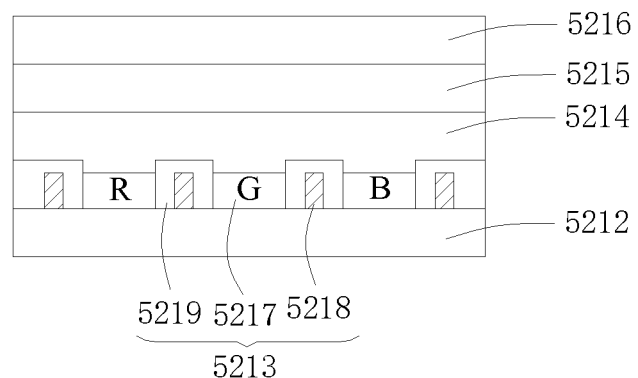
FIG. 17 is a side view of the first display region in accordance with another embodiment, when the display screen is energized.

Referring to FIG. 17 together, in the first display region, the display screen 500 includes an array substrate 5212, a first typed light emitting unit 5213, a thin film encapsulation layer (TFE) 5214, a touch screen 5215, and a protective film 5216 which are sequentially stacked.

The first typed light emitting unit 5213 includes a pixel region 5237, a electrochromic light transmittance material 5218 around the pixel region 5237, and a pixel defining layer 5219 formed around the pixel region 5237.

Figure 18:
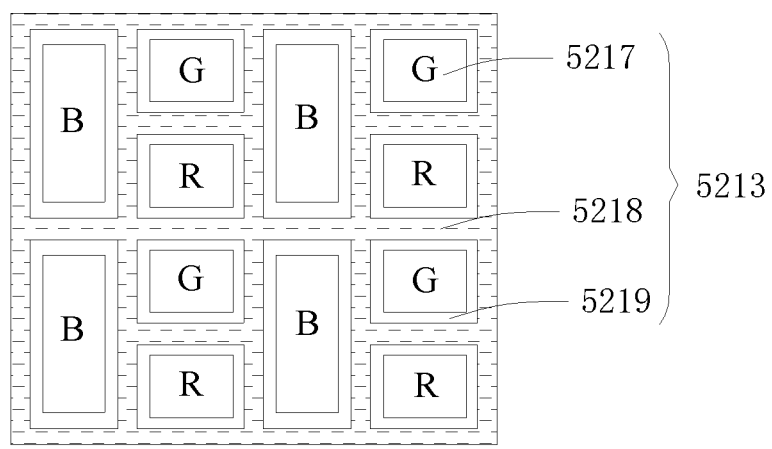
FIG. 18 is a top view of the first display region in accordance with another embodiment, when the display screen is energized.

Referring to FIG. 18 together, when it is energized, the pixel region 5237 of the first typed light emitting unit 5213 is caused to emit light, and the display screen 500 is illuminated. At the same time, the electrochromic light transmittance material 5218 exhibits light absorbing property, and the light transmittance of the electrochromic light transmittance material 5642 is less than 10%, which can reduce the influence of ambient light and the image can be normally displayed.

Figure 19:
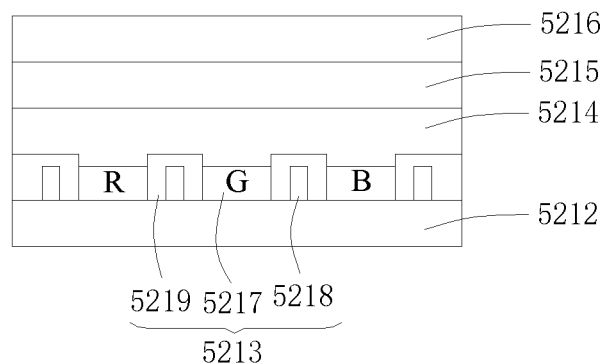
FIG. 19 is a side view of the first display region in accordance with another embodiment, when the display screen is not energized.
Figure 20:
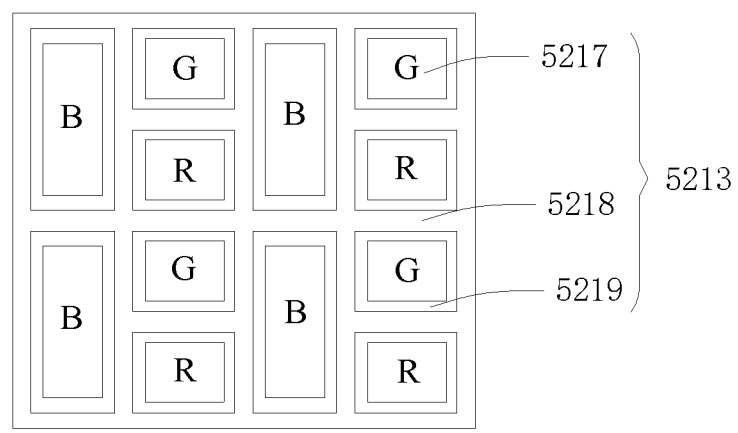
FIG. 20 is a top view of a side view of the first display region in accordance with another embodiment, when the display screen is not energized.

Referring to FIGS. 19 and 20 together, when the conductive layer 521 is unenergized, the electrochromic light transmittance material 5218 exhibits light transparent property. At this time, the light transmittance of the electrochromic light transmittance material 5218 is greater than 90%. Thus, the ambient light can smoothly pass through the first display region of display screen 500.

Referring to FIG. 13 together, the electronic device 5118 according to an embodiment includes the display screen 500 of the forgoing embodiments and an under-screen photosensitive module 5119.

The display screen 500 of the forgoing embodiments includes a conductive layer 521 and a first typed light emitting unit 522 formed on the conductive layer 521. The first typed light emitting unit 522 includes a pixel region 523 and an electrochromic light transmittance material 524 located around the pixel region 523. When the conductive layer 521 is energized, the electrochromic light transmittance material 524 exhibits light absorbing property, and when the conductive layer 521 is unenergized, the electrochromic light transmittance material 524 exhibits light transparent property.

The under-screen photosensitive module 5119 can sense the light that is incident through the display screen 500.

In the electronic device 5118 of the present application, since the first typed light emitting unit 522 of the display screen 500 has the electrochromic light transmittance material 524, when the conductive layer 521 is energized, the pixel region 523 of the first typed light emitting unit 522 is caused to emit light, and the electrochromic light transmittance material 524 exhibits light absorbing property to reduce the influence of ambient light, so that the images can be displayed normally. Thus, the polarizer can be omitted from the display screen 500 of the electronic device 5118, thereby improving the display screen 500.

On the basis of the foregoing embodiments, the under-screen photosensitive module 5119 is at least one of a photoelectric sensor and a camera.

In the electronic device 5118 of the present application, since the first display region 517 of the display screen 500 contains the electrochromic light transmittance material 524, when the conductive layer 521 is energized, the images can be normally displayed in the first display region 517; and when the conductive layer 521 is unenergized, the pixel region 523 of the first typed light emitting unit 522 does not emit light, and the electrochromic light transmittance material 524 is transparent, whereby the first display region 517 becomes nearly transparent, and the ambient light can smoothly pass through the first display region 517 of the display screen 500. In this way, the under-screen photosensitive module 5119 of at least one of the photoelectric sensor and the camera can be disposed behind the display screen 500 and be aligned with the first display region 517. The display screen 500 according to the present application is not required to reserve a position for the afore-mentioned under-screen photosensitive module 5119, and even the non-display area of the display screen 500 in the prior art can be omitted, thereby enlarging the screen ratio and optimizing the use experience.

Figure 21:
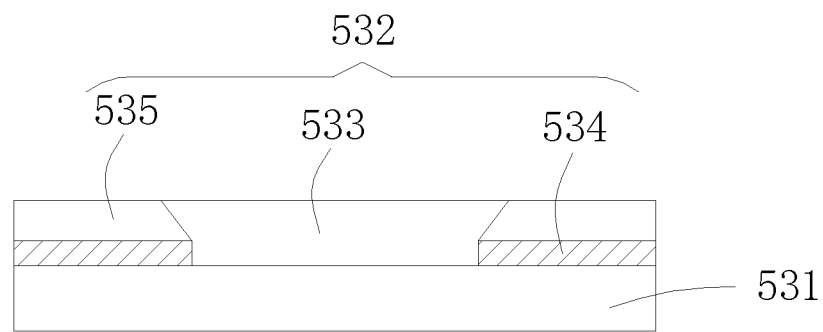
FIG. 21 is a side view of the display screen in the first display region in accordance with an embodiment.
Figure 22:
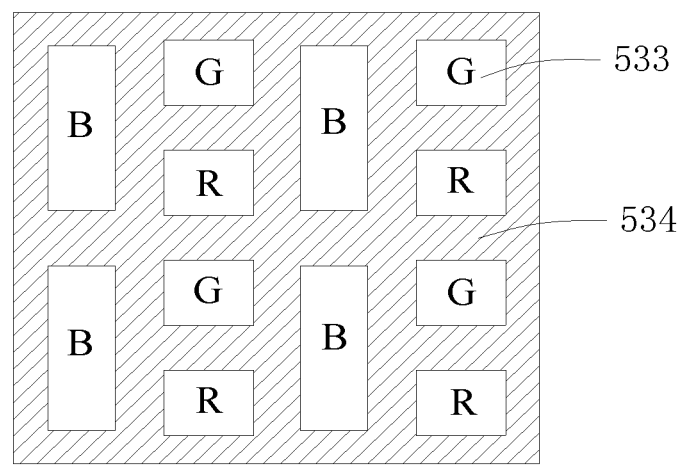
FIG. 22 is a bottom view of the display screen in the first display region in accordance with embodiment.
Figure 23:
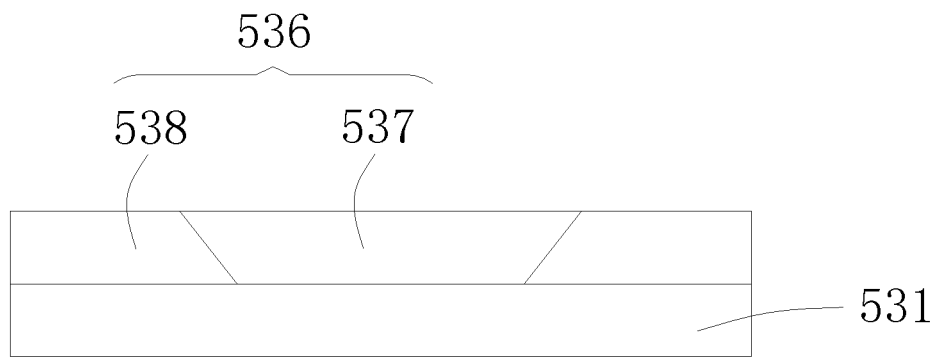
FIG. 23 is a side view of the display screen in the second display region in accordance with an embodiment.

In an embodiment, referring to FIG. 21 to FIG. 23, the display screen 500 according to an embodiment includes a conductive layer 531 and a first typed light emitting unit 532 formed on the conductive layer 531.

The first typed light emitting unit 532 includes a pixel region 533 and an electrochromic light transmittance material 534 around the pixel region 533. The electrochromic light transmittance material 534 exhibits light absorbing property when the conductive layer 531 is energized, and the electrochromic light transmittance material 534 exhibits light transparent property when the conductive layer 531 is unenergized.

Since the afore-mentioned first typed light emitting unit 532 has the electrochromic light transmittance material 534, when the conductive layer 531 is energized, the pixel region 533 of the first typed light emitting unit 532 emits light, and the electrochromic light transmittance material 534 exhibits light absorbing property to reduce the influence of ambient light, so that the images can be displayed normally. Thus, no polarizer is required to be used in the display screen 500, thereby improving the display screen 500.

On the basis of the foregoing embodiments, in the first typed light emitting unit 532, a transparent pixel defining layer 535 is disposed on the electrochromic light transmittance material 534. That is, the pixel defining layer 535 is laminated on the electrochromic light transmittance material 534. The electrochromic light transmittance material 534 exhibits light absorbing property or light transparent property according to an energization condition, and the pixel defining layer 535 can separate each pixel, and the laminated structure of the two combines respective advantages, thereby further improving the display screen 500.

On the basis of the foregoing embodiments, a thickness of the electrochromic light transmittance material 534 is smaller than a thickness of the pixel defining layer 535 in the pixel region 533. The purpose of such an arrangement is to avoid buffering effect of the pixel defining layer 535 from being affected due to that the thickness of the pixel defining layer 535 is small.

On the basis of the forgoing embodiments, the electrochromic light transmittance material 534 has a thickness ranging from 1 μm to 3 μm, and the pixel defining layer 535 has a thickness ranging from 3 μm to 5 μm. The inventors of the present application have found through research that when the thicknesses of the electrochromic light transmittance material 534 and the pixel defining layer 535 are respectively set to the aforementioned values, the advantages of the electrochromic light transmittance material 534 and the pixel defining layer 535 can be combined and the effect thereof is optimal. That is, when the conductive layer 531 is energized, the electrochromic light transmittance material 534 exhibits light absorbing property, and the images can be normally displayed. When the conductive layer 531 is unenergized, the light transparent property of the electrochromic light transmittance material 534 can satisfy imaging requirements. At the same time, the buffering effect of the pixel defining layer 535 can protect the pixel region 533.

On the basis of the foregoing embodiments, referring to FIG. 8 together, the display screen 500 further includes a second typed light emitting unit 536, and the second typed light emitting unit 536 includes a pixel region 537 and a pixel defining layer 538 formed around the pixel region 537. The pixel defining layer 538 contains no electrochromic light transmittance material. A plurality of the first typed light emitting units 532 are integrated into the first display region 517, and a plurality of second-type light-emitting units 536 are integrated into the second display region 518.

Since the first display region 517 of the display screen 500 of the forgoing embodiments includes the electrochromic light transmittance material 534, when the conductive layer 531 is energized, the images can be normally displayed in the first display region 517; and when the conductive layer 531 is unenergized, the pixel region 533 of the first typed light emitting unit 532 does not emit light, the electrochromic light transmittance material 534 is diaphanous, whereby the first display region 517 becomes nearly transparent, and the ambient light can smoothly pass through the first display region 517 of the display screen 500. In this way, the front camera can be disposed behind the display screen 500 and be aligned with the first display region 517, so that when the front camera is used, the front camera can be used to image as long as the conductive layer 531 of the first display region 517 is unenergized. The display screen 500 according to the present embodiment is not required to reserve a position for the front camera, and even eliminates the non-display area of the display screen in the prior art, thereby enlarging the screen ratio and optimizing the use experience.

On the basis of the foregoing embodiment, no polarizer is disposed above the first display region 517. Thus, when the front camera is used, the ambient light that is irradiated into the front camera can be further enhanced, and the image quality thereof can be further improved.

On the basis of the foregoing embodiments, the electrochromic light transmittance material is one of polyaniline, polythiophene, and polythiophene derivative, or one of tungsten oxide, titanium oxide, and nickel oxide.

For organic electrochromic light transmittance materials such as polyaniline, polythiophene and polythiophene derivatives, on the one hand, when the conductive layer 531 is energized, the electrochromic light transmittance materials of polyaniline, polythiophene, and polythiophene derivatives exhibit light absorbing property to reduce the influence of external light; and when the conductive layer 531 is unenergized, the electrochromic light transmittance materials of polyaniline, polythiophene, and polythiophene derivatives exhibit light transparent property, the transmittance of these materials is relatively large, so that the first display region 517 is nearly transparent, and the ambient light can smoothly pass therethrough, and the camera can image normally; on the other hand, the polyaniline, the polythiophene, and the polythiophene derivatives are all organic material, and are disposed outside the pixel region 533 of the first typed light emitting unit 532 to protect the pixel region 533 of the first typed light emitting unit 532, at the same time have certain flexibility so as to be well fitted to the pixel region 533.

The inorganic electrochromic light transmittance materials such as tungsten oxide, titanium oxide, and nickel oxide have the advantages of high coloring efficiency, good reversibility, short response time, long lifetime, and low cost, which are beneficial for applying to the display screen 500 of the present application.

On the basis of the foregoing embodiments, the polythiophene derivative is 1,3-dimethyl polythiophene or 1,4-p-dimethyl polythiophene. When the conductive layer 531 is energized or unenergized, the transmittance of the two polythiophene derivatives can be rapidly and stably changed under the action of an applied electric field, and the display screen 500 can be quickly switched between a display state and a transparent state. At the same time, it has the advantages of low cost, good optical quality, and good cycle reversibility, etc.

Figure 24:
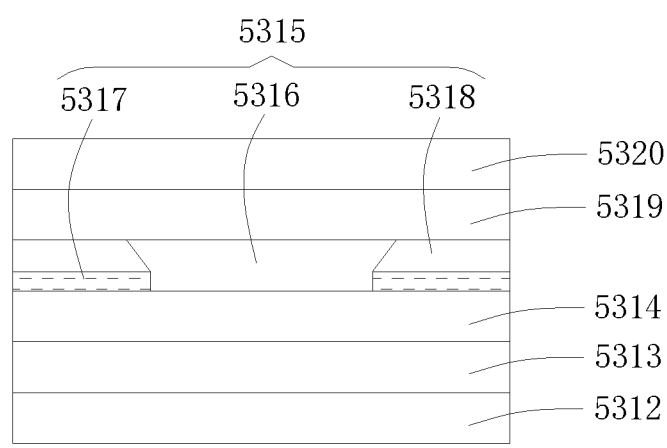
FIG. 24 is a side view of the first display region in accordance with another embodiment, when the display screen is energized.

Referring to FIG. 24 together, in the first display region, the display screen 500 includes a wiring layer 5312, a planarization layer 5313, an anode 5314, a first typed light emitting unit 5315, a cathode 5319, and a thin film encapsulation layer (TFE) 5320 which are sequentially stacked.

The first typed light emitting unit 5315 includes a pixel region 5316 and an electrochromic light transmittance material 5317 located around the pixel region 5316.

Figure 25:
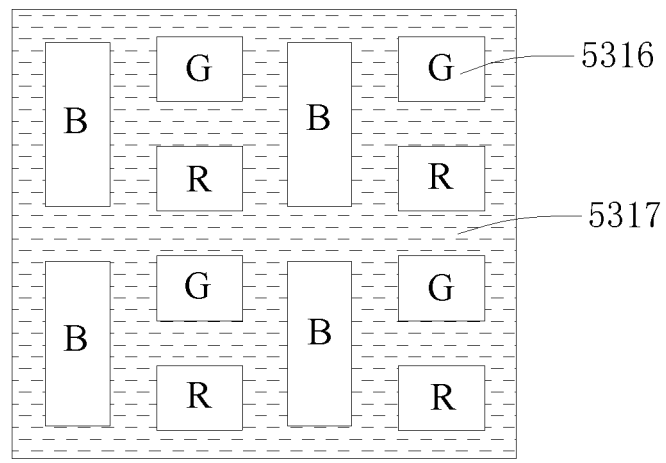
FIG. 25 is a top view of the first display region in accordance with another embodiment, when the display screen is energized.

Referring to FIG. 25 together, when the conductive layer 531 is energized, the pixel region 5316 of the first typed light emitting unit 5315 is caused to emit light, and the display screen 500 is illuminated. At the same time, the electrochromic light transmittance material 5317 exhibits light absorbing property, and the light transmittance of the electrochromic light transmittance material 5317 is less than 10%, which can reduce the influence of ambient light and the images can be displayed normally.

Figure 26:
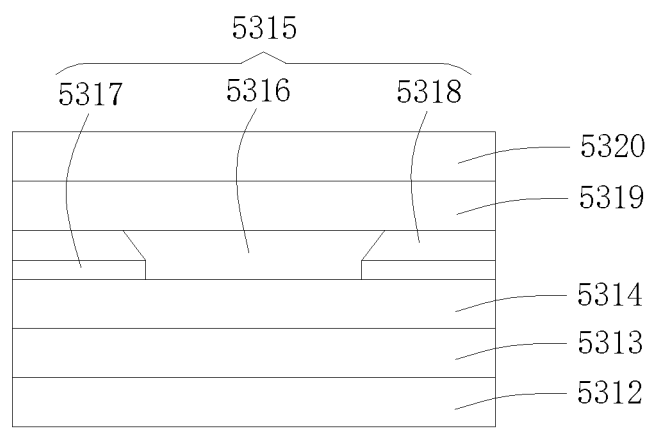
FIG. 26 is a side view of the first display region in accordance with another embodiment, when the display screen is not energized.
Figure 27:
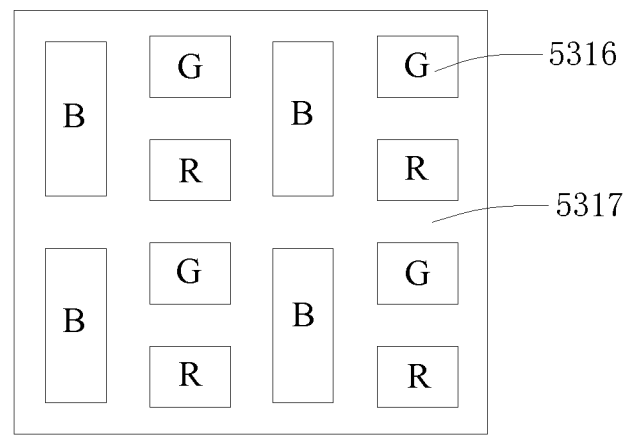
FIG. 27 is a top view of a side view of the first display region in accordance with another embodiment, when the display screen is energized.

Referring to FIGS. 26 and 27 together, when the conductive layer 531 is unenergized, the electrochromic light transmittance material 5317 exhibits light transparent property. At this time, the light transmittance of the electrochromic light transmittance material 5317 is greater than 90%. Thus, the ambient light can smoothly pass through the first display region of display screen 500.

Referring to FIG. 13 together, the electronic device 5118 according to an embodiment includes the display screen 500 of the forgoing embodiments and an under-screen photosensitive module 5119.

The display screen 500 of the forgoing embodiments includes a conductive layer 531 and a first typed light emitting unit 532 formed on the conductive layer 531. The first typed light emitting unit 532 includes a pixel region 533 and an electrochromic light transmittance material 534 around the pixel region 533. The electrochromic light transmittance material 534 exhibits light absorbing property when the conductive layer 531 is energized, and the electrochromic light transmittance material 534 exhibits light transparent property when the conductive layer 531 is unenergized.

The under-screen photosensitive module 5119 can sense the light that is incident through the display screen 500.

In the electronic device 5118 of the present application, since the first typed light emitting unit 532 of the display screen 500 has the electrochromic light transmittance material 534, when the conductive layer 531 is energized, the pixel region 533 of the first typed light emitting unit 532 is caused to emit light, and the electrochromic light transmittance material 534 exhibits light absorbing property to reduce the influence of ambient light, so that the images can be normally displayed. Thus, the polarizer can be omitted from the display screen 500 of the electronic device 5118, thereby improving the display screen 500.

On the basis of the foregoing embodiments, the under-screen photosensitive module 5119 is at least one of a photoelectric sensor and a camera.

In the electronic device 5118 of the present application, since the first display region 517 of the display screen 500 contains the electrochromic light transmittance material 534, when the conductive layer 531 is energized, the images can be normally displayed in the first display region 517; and when the conductive layer 521 is unenergized, the pixel region 533 of the first typed light emitting unit 532 does not emit light, and the electrochromic light transmittance material 534 is diaphanous, whereby the first display region 517 becomes nearly transparent, and the ambient light can smoothly pass through the first display region 517 of the display screen 500. In this way, the under-screen photosensitive module 5119 of at least one of the photoelectric sensor and the camera can be disposed behind the display screen and be aligned with the first display region 517. The display screen 500 according to the present application is not required to reserve a position for the above-mentioned under-screen photosensitive module 5119, and even eliminates the non-display area of the display screen 500, thereby enlarging the screen ratio and optimizing the use experience.

Figure 28:
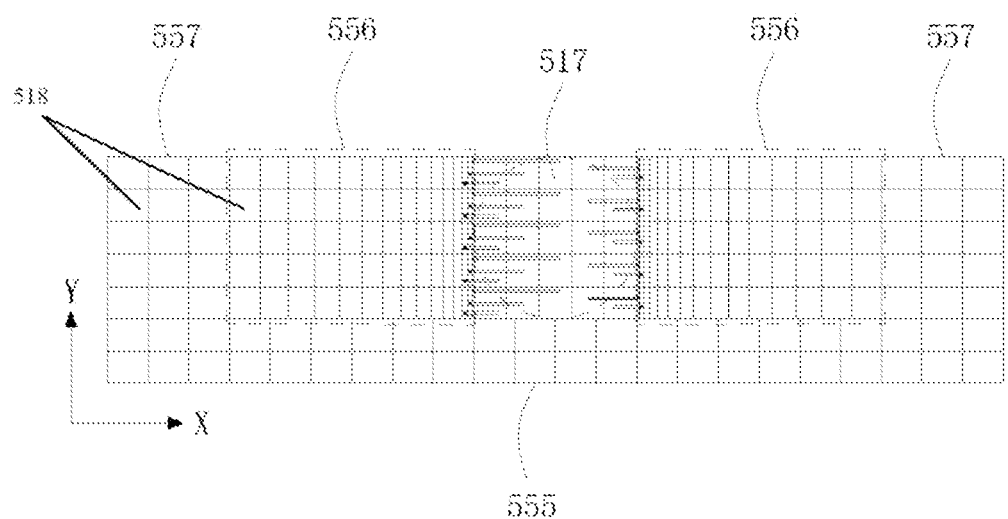
FIG. 28 is a distribution diagram of a driving array on the display screen in accordance with an embodiment.
Figure 29:
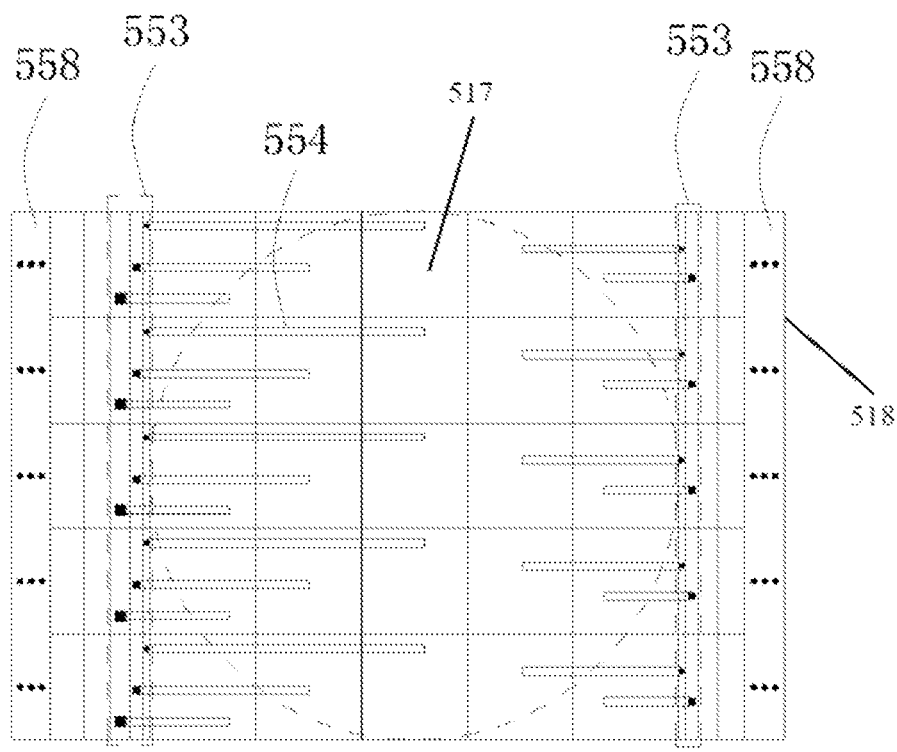
FIG. 29 is an enlarged view of a portion of the distribution diagram of the driving array on the display screen in FIG. 28.

In an embodiment, referring to FIG. 8, FIG. 28, and FIG. 29, the display screen 500 according to an embodiment has a second display region 518 and a first display region 517. A driving array 553 of pixels in the first display region 517 is deviated from the first display region 517. It is advantageous to improve the light transmittance of the first display region 517, so that the ambient light can smoothly pass through the first display region 517 of the display screen, so that the imaging can be achieved.

On the basis of the foregoing embodiments, the driving array 553 of the pixels in the first display region 517 is located in the second display region 518 and is connected to the transparent anode of the pixels in the first display region 517 through transparent traces 554. Since a portion of the transparent traces 554 is still located in the first display region 517, the driving array 553 of the pixels in the first display region 517 is connected to the transparent anodes of the pixels in the first display region through the transparent traces 554 so as to avoid light in the first display region 517 from being blocked by non-transparent traces, thereby increasing the light transmission of the first display region 517.

On the basis of the foregoing embodiments, the transparent traces 554 are made of at least one of indium tin oxides (ITO) and indium gallium zinc oxide (IGZO). ITO and IGZO have excellent transmittance and conductivity. On one hand, since the ITO and the IGZO have relatively good transmittance, so that the ITO and the IGZO can prevent the light in the first display region 517 from being blocked by non-transparent traces, thereby improving the transmittance of the first display region 517. On the other hand, since the ITO and the IGZO have good conductivity, so that current can be quickly transmitted via the transparent traces 554, and when the images are required to be displayed, the pixels in the first display region 517 can be quickly driven to emit light by the driving array 553 of the pixels in the first display region 517 so as to display the images normally.

On the basis of the foregoing embodiments, the cathode in the first display region 517 is made of a transparent material. This can further increase the transmittance of the first display region 517.

On the basis of the foregoing embodiments, the cathode is made of phosphorus-doped ITO. The phosphorus-doped ITO has good conductivity and can meet the requirements of the cathode for conductivity. At the same time, the phosphorus-doped ITO has good transmittance and can increase the transmittance of the cathode.

The transparent traces 554 and the cathode in the first display region 517 are both made of transparent materials such that the pixels in the first display region 517 are nearly transparent. In addition, the driving array 553 of the pixels in the first display region 517 is deviated from the first display region 517. This can make the entire first display region 517 nearly transparent, so that the ambient light can smoothly pass therethrough, and the camera can image normally.

Furthermore, on the basis of the foregoing embodiments, the anode of the first display region 517 is made of ITO to further increase the transmittance of the first display region 517.

On the basis of the foregoing embodiments, a driving array substrate 555 corresponding to the second display region 518 includes a first driving region 556 and a second driving region 557. The first driving region 556 is adjacent to the first display region 517.

A driving array 558 of pixels in the second display region 518 is disposed in the first driving region 556 and the second driving region 557, and the driving array 553 of the pixels in the first display region 517 is disposed in the first driving region 556.

This can shorten a distance between the driving array 553 of the pixels in the first display region 517 and the pixels in the first display region 517, thereby reducing loss of wires and facilitating to uniformly display images.

On the basis the foregoing embodiments, an area ratio of the first driving region 556 to the second driving region 557 is (3~9):10000. In this way, the driving array 553 of the pixels in the first display region 517 located in the first driving region 556 is densely distributed on a periphery of the first display region 517, which can reduce the loss of the wires and facilitate to uniformly display the images.

The first driving region 556 and the second driving region 557 in the display screen of the present application are not limited thereto.

On the basis of the forgoing embodiments, a ratio of a pixel density of the first display region 517 to a pixel density of the second display region 518 is (1~0.5):1. In this way, when the images are required to be displayed, the pixels in the first display region 517 can be driven to emit light by the driving array 553 of the pixels in the first display region 517, thereby displaying the images normally along with the second display region 518.

When the ratio of the pixel density of the first display region 517 to the pixel density of the second display region 518 is 1:1, the displaying effect of the images is optimal.

On the basis of the foregoing embodiments, each pixel in the first display region 517 is separately driven by means of separate driving, so that the pixels of the first display region 517 can be turned off in time when the camera is working, and the pixels of the first display region 517 can be turned on in time when the camera is not working.

Furthermore, in the present embodiment, the driving array 553 of the pixels in the first display region 517 is distributed adjacent to left and right sides of the first display region 517, i.e., along an X direction and an opposite direction of the X direction in FIG. 28. The driving array 553 of the pixels in the first display region 517 can also be disposed along a Y direction in FIG. 28.

Preferably, the density of the driving array 553 of the pixels in the first display region 517 decreases gradually along an outside adjacent to the first display region 517, and a total amount of driving circuits on any horizontal row along the X direction is the same, so that the region can buffer a connection relationship between the pixel and the driving current.

Preferably, the driving circuits of each horizontal row of the pixels in the first display region 517 are disposed along a lateral direction, thereby avoiding wire crossing and facilitating preparation. In the display screen of the present application, when the images are required to be displayed, the driving array of the pixels in the second display region can drive the pixels in the second display region to emit light, thereby displaying the images normally along with the first display region. When the imaging is required, since the driving array of the pixels in the second display region is deviated from the second display region, the transmittance of the second display region is improved, so that the ambient light can smoothly pass through the second display region of the display screen, so that the imaging can be achieved. The display screen according to the present application can eliminate the non-display area of the display screen, thereby enlarging the screen ratio and optimizing the use experience.

Referring to FIG. 13, an electronic device 5118 according to an embodiment includes a display screen 500 and an under-screen photosensitive module 5119.

The display screen 500 has a second display region 518 and a first display region 517. A driving array of pixels in the first display region 517 is deviated from the first display region 517.

The under-screen photosensitive module 5119 can sense the light that is incident through the display screen 500.

In the electronic device of the present application, when an image is required to be displayed, the driving array of the pixels in the second display region of the display screen can drive the pixels in the second display region to emit light, thereby displaying the image normally along with the first display region; and when the under-photosensitive module is required to work, since the driving array of the pixels in the second display region is deviated from the second display region, the transmittance of the second display region is improved, so that the ambient light can smoothly pass through the second display region of the display screen, so as to ensure that the photosensitive module under the display screen can work normally. The display screen of the electronic device according to the present application can eliminate the non-display area of the display screen in the prior art, thereby enlarging the screen ratio and optimizing the use experience.

On the basis of the forgoing embodiments, the under-screen photosensitive module 5119 is at least one of a photoelectric sensor and a camera. The under-screen photosensitive module 5119 can also be other components.

In an embodiment, a method of fabricating an organic light emitting display device can include the following steps.

Figure 30:
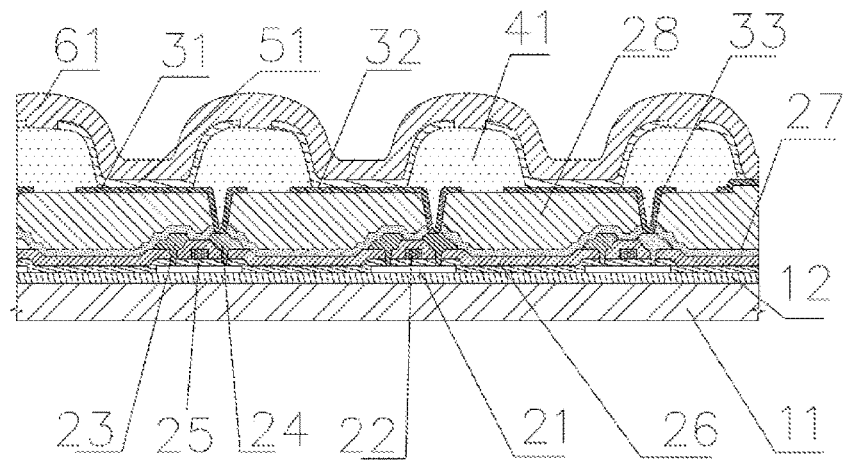
FIG. 30 is a schematic view illustrating a layered structure of an organic light emitting display device in accordance with an embodiment.

Referring to FIG. 30, firstly, a substrate 11 is prepared. The substrate 11 has a first color sub-pixel region, a second color sub-pixel region, and a third color sub-pixel region. A set of the first color sub-pixel region, the second color sub-pixel region, and the third color sub-pixel region can define a pixel region. The substrate 11 can have a plurality of pixel regions. In an embodiment, the first color sub-pixel region can be a sub-pixel region that emits red light. The second color sub-pixel region can be a sub-pixel region that emits green light. The third color sub-pixel region can be a sub-pixel region that emits blue light.

The substrate 11 can be formed of a suitable material such as a glass material, a metal material, or a plastic material including polyethylene terephthalate (PET), polyethylene naphthalate (PEN), or polyimide, etc. A thin film transistor (TFT) can be disposed on the substrate 11. In an embodiment, an additional layer such as a buffer layer 12 can be formed on substrate 11 prior to forming the TFT. The buffer layer 12 can be formed on an entire surface of the substrate 11, or can be formed by being patterned.

The buffer layer 12 can have a layered structure made of a suitable material including PET, PEN, polyacrylate, and/or polyimide, etc. in a manner of a single layer or a multilayer stack. The buffer layer 12 can also be made of silicon oxide or silicon nitride, or can include a composite layer of an organic material and/or an inorganic material.

The TFT can control an emission of each sub-pixel, or can control an amount of the emission when each sub-pixel emits light. The TFT can include a semiconductor layer 21, a gate electrode 22, a source electrode 23, and a drain electrode 24.

The semiconductor layer 21 can be made of an amorphous silicon layer, a silicon oxide layer metal oxide, or a polysilicon layer, or can be made of an organic semiconductor material. In an embodiment, the semiconductor layer 21 includes a channel region, and a source region and a drain region doped with dopants.

The semiconductor layer 21 can be covered with the gate insulating layer 25. The gate electrode 22 can be disposed on the gate insulating layer 25. In general, the gate insulating layer 25 can cover the entire surface of the substrate 11. In an embodiment, the gate insulating layer 25 can be formed via patterning. The gate insulating layer 25 can be made of silicon oxide, silicon nitride, or other suitable insulating organic or inorganic material in consideration of adhesion between adjacent layers, formability of stacked target layers, and surface flatness. The gate electrode 22 can be covered by an interlayer insulating layer 26 made of silicon oxide, silicon nitride, and/or other suitable insulating organic or inorganic materials. A portion of the gate insulating layer 25 and the interlayer insulating layer 26 can be removed, and a contact hole is formed after the removal to expose a predetermined region of the semiconductor layer 21. The source electrode 23 and the drain electrode 24 can contact the semiconductor layer 21 via the contact hole. The source electrode 23 and the drain electrode 24 can be formed by a single material layer or a composite layer including at least one of aluminum (Al), platinum (Pt), palladium (Pd), silver (Ag), magnesium (Mg), gold (Au), nickel (Ni), niobium (Nd), iridium (Ir), chromium (Cr), lithium (Li), calcium (Ca), molybdenum (Mo), titanium (Ti), tungsten (W), and copper (Cu) or other suitable alloy.

The TFT can be covered by a protective layer 27 made of silicon oxide, silicon nitride, and/or other suitable insulating organic or inorganic material. The protective layer 27 can cover the entire substrate 11 or part of the substrate 11. Since the TFT having a complicated layer structure is disposed under the protective layer 27, a top surface of the protective layer 27 may be insufficiently flat. Therefore, it is necessary to form a planarization layer 28 on the protective layer 27 so as to form a sufficiently flat top surface.

After the planarization layer 28 is formed, a through hole can be defined in the protective layer 27 and the planarizing layer 28 to expose the source electrode 23 and drain electrode 24 of the TFT.

Then, a first color sub-pixel electrode 31, a second color sub-pixel electrode 32, and a third color sub-pixel electrode 33 are formed on the planarization layer 28. The first color sub-pixel electrode 31 is formed in the first color sub-pixel region. The second color sub-pixel electrode 32 is formed in the second color sub-pixel region. The third color sub-pixel electrode 33 is formed in the third color sub-pixel region. Herein, the first color sub-pixel electrode 31, the second color sub-pixel electrode 32, and the third color sub-pixel electrode 33 can be formed simultaneously or synchronously. Each of the first color sub-pixel electrode 31, the second color sub-pixel electrode 32, and the third color sub-pixel electrode 33 can be electrically connected to the TFT via the through hole. Herein, the first color sub-pixel electrode 31, the second color sub-pixel electrode 32, and the third color sub-pixel electrode 33 are generally referred to as anodes.

Each of the first color sub-pixel electrode 31, the second color sub-pixel electrode 32, and the third color sub-pixel electrode 33 can be formed as a transparent (transflective) electrode or a reflective electrode. When the first color sub-pixel electrode 31, the second color sub-pixel electrode 32, and the third color sub-pixel electrode 33 are formed as transparent (transflective) electrodes. The first color sub-pixel electrode 31, the second color sub-pixel electrode 32, and the third color sub-pixel electrode 33 can be made of indium tin oxide (ITO), indium zinc oxide (IZO), zinc oxide (ZnO), indium oxide ($In_2O_3$), indium gallium oxide (IGO), or aluminum zinc oxide (AZO).

When the first color sub-pixel electrode 31, the second color sub-pixel electrode 32, and the third color sub-pixel electrode 33 are formed as reflective electrodes, the first color sub-pixel electrode 31, the second color sub-pixel electrode 32, and the third color sub-pixel electrode 33 can be formed as a reflective layer made of silver (Ag), magnesium (Mg), aluminum (Al), platinum (Pt), palladium (Pd), gold (Au), Nickel (Ni), neodymium (Nd), iridium (Ir), chromium (Cr), or mixture of any of these materials, and an auxiliary layer made of transparent electrode materials such as indium tin oxide (ITO), indium zinc oxide (IZO), zinc oxide (ZnO), or indium oxide ($In_2O_3$), etc. The structures and materials of the first color sub-pixel electrode 31, the second color sub-pixel electrode 32, and the third color sub-pixel electrode 33 are not limited thereto and can be changed.

After the first color sub-pixel electrode 31, the second color sub-pixel electrode 32, and the third color sub-pixel electrode 33 are formed, as shown in FIG. 30, a pixel defining layer 41 (PDL) can be formed. The formed PDL simultaneously covers the first color sub-pixel electrode 31, the second color sub-pixel electrode 32, and the third color sub-pixel electrode 33. The PDL can be used to define sub-pixels by having an opening corresponding to each sub-pixel (i.e., an opening exposing a central portion of each sub-pixel). The PDL can be formed by a suitable organic material such as polyacrylate, polyimide, etc., or a single material layer or a composite layer including a suitable inorganic material.

The PDL can be formed via the following manner, i.e., forming a PDL layer on the entire surface of the substrate 11 by using suitable PDL material, so as to cover the first color sub-pixel electrode 31, the second color sub-pixel electrode 32, and the third color sub-pixel electrode 33. Then, the PDL layer is patterned to expose the portions of the first color sub-pixel electrode 31, the second color sub-pixel electrode 32, and the third color sub-pixel electrode 33.

A light emitting layer 51 can be formed via evaporating luminescent material. The evaporated material covers a portion of the first color sub-pixel electrode 31 that is not covered by the PDL layer, a portion of the second color sub-pixel electrode 32 that is not covered by the PDL layer, a portion of the third color sub-pixel electrode 33 that is not covered by the PDL layer, and a top surface of the PDL layer.

Luminescent materials that emit red, green, and blue light can be evaporated using a precision metal mask.

Then, a counter electrode 61 covering the first color sub-pixel region, the second color sub-pixel region, and the third color sub-pixel region is formed via evaporation. The counter electrode 61 can be integrally formed with respect to a plurality of sub-pixels so as to cover the entire display area. The counter electrode 61 is generally referred as a cathode.

The counter electrode 61 contacts an electrode supply line outside the display area, so that the electrode supply line can receive an electrical signal. The counter electrode 61 can be formed as a transparent electrode or a reflective electrode. When the counter electrode 61 is formed as a transparent electrode, the counter electrode 61 can include a layer formed by depositing Li, Ca, LiF/Ca, LiF/Al, Al, Mg, or a mixed material of any of these materials in a direction toward the light emitting layer and an auxiliary electrode or a bus electrode line made of a transparent (transflective) material including ITO, IZO, ZnO, or $In_2O_3$. When the counter electrode 61 is formed as a reflective electrode, the counter electrode 61 can have a layer selected from one or more materials of Li, Ca, LiF/Ca, LiF/Al, Al, Ag, and Mg. However, the configuration and material of the counter electrode 61 are not limited thereto, and thus can be changed.

Figure 31:
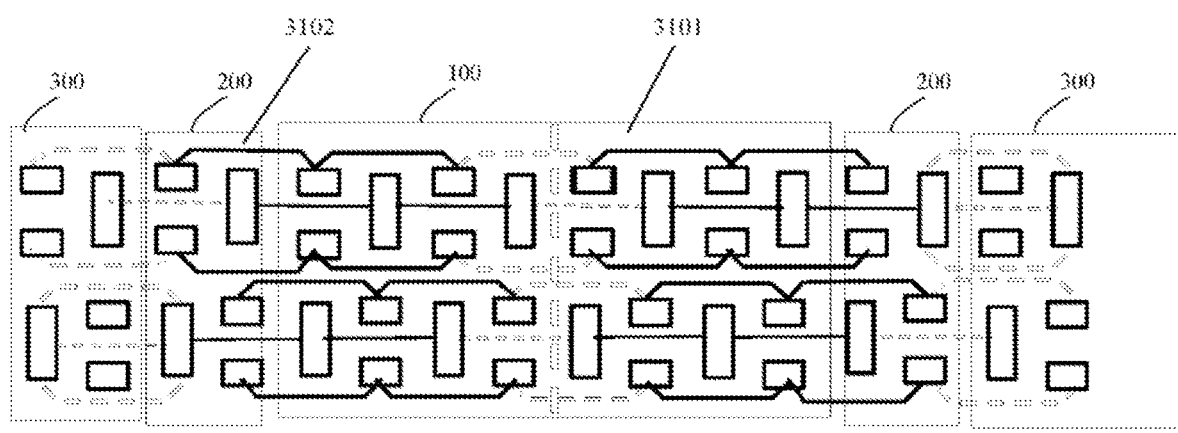
FIG. 31 is a schematic diagram of a sub-pixel driving structure of the display screen in accordance with an embodiment.

The present application provides a display screen, as shown in FIG. 31, which includes a first region 3101 and a second region 3102. A first typed light emitting unit 100 is disposed in the first region 3101, a second typed light emitting unit 200 is disposed in the second region 3102, and the first typed light emitting unit 100 is different from the second typed light emitting unit 200.

Specifically, a driving array of the first typed light emitting unit 100 is deviated from the first region 3101, and a driving array of the second typed light emitting unit 200 is located in the second region 3102. That is, the driving array of the second typed light emitting unit 200 is normally disposed in the second region 3102, while the driving array of the first typed light emitting unit 100 is not disposed in the first region 3101, but in the second region 3102 deviated from the first region 3101. In this way, the driving array of the first typed light emitting unit 100 is not disposed in the first region 3101. It can be seen from a layered structure of the organic light emitting device in FIG. 30, the gate electrode 22, the source electrode 23, and the drain electrode 24 in the TFT driving array can be formed as a metal mesh. When light enters an interior thereof from an outside of the display screen, the metal mesh causes diffraction or interference of light, which is generally referred as a grating effect. In this way, when the under-screen photosensitive module is placed under the display screen, or embedded inside the display screen, the operation of the under-screen photosensitive module will be affected. However, in the embodiment of the present application, the driving array of the first typed light emitting unit 100 is deviated from the first region 3101, so that the interference and diffraction of the light caused by the driving array can be reduced, so as to improve an imaging effect.

Furthermore, in an embodiment of the present application, a plurality of pixel groups exist in the first typed light emitting unit 100, each pixel group has a plurality of first typed sub-pixels, and a plurality of the first typed sub-pixels in each pixel group are driven in series.

Furthermore, in another embodiment of the present application, one of the plurality of pixel groups is one of a red pixel array, a green pixel array, and a blue pixel array.

The first color sub-pixel, the second color sub-pixel, and the third color sub-pixel can emit color light of different colors, for example, three colors of red (R), green (G), and blue (B). The color light emitted by the three sub-pixels are different from each other. The first color sub-pixel, the second color sub-pixel, and the third color sub-pixel herein can also be sub-pixels of other color light, and can also be a sub-pixel combination in which sub-pixels of different color light are superimposed. In order to maintain white balance and reduce production cost, the first color sub-pixel, the second color sub-pixel, and the third color sub-pixel can be a red sub-pixel, a green sub-pixel, and a blue sub-pixel, respectively.

A pixel group can be one of a red pixel array, a green pixel array, and a blue pixel array. A plurality of pixel groups can be formed by mixing a red pixel array, a green pixel array, and a blue pixel array to achieve white balance.

Furthermore, in an embodiment of the present application, the first typed light emitting unit 100 is driven by the driving array of the second typed light emitting unit 200.

Referring to FIG. 31, the driving array of the first typed light emitting unit 100 is driven by the driving array of the second typed light emitting unit 200 located on both sides of the first typed light emitting unit 100. A pixel group in the first typed light emitting unit 100 emits light or emit no light at the same time. In a specific application, the pixel group can be used to indicate a battery power indicator, a network signal strength indication, and the like.

Furthermore, in an embodiment of the present application, for each pixel group in the first typed light emitting unit 100, the second typed light emitting unit 200 has a plurality of second typed sub-pixels, and there are driving sub-pixels in the plurality of second sub-pixels corresponding to and connected in series to each pixel group.

Furthermore, in an embodiment of the present application, the color of the driving sub-pixel is the same as the color of the pixel group in the first typed light emitting unit 100 driven in series.

Referring to FIG. 31 again, One pixel group of the first typed light emitting unit 100 corresponds to one driving sub-pixel of the second typed light emitting unit 200. Specifically, for example, the red pixel array of the first typed light emitting unit 100 corresponds to one red sub-pixel on the left side of the red pixel array of the first typed light emitting unit 100 or corresponds to one red sub-pixel on the right side of the red pixel array of the first typed light emitting unit 100. The red pixel array and the red sub-pixel can be on the same row, or the same column, can be separated by a certain number of rows or a certain number of columns. Herein, the color light emitted by a pixel group can be the same as the color light emitted by the driving sub-pixel, so as to facilitate the control thereof.

Furthermore, in an embodiment of the present application, any one of the plurality of pixel groups extends from a first side of the first region 3101 to a second side opposite to the first side, and two sub-pixels at two ends of the pixel group are connected in series with two driving sub-pixels in the second typed light emitting unit 200, respectively.

Referring to FIG. 31 again, a pixel group of the first typed light emitting unit 100 corresponds to (two) driving sub-pixels of the second typed light emitting units 200. The (two) driving sub-pixels of the second typed light emitting units 200 can be located on both ends of the pixel group. That is, any one of the pixel groups extends from the first side of the first region to the second side opposite to the first side, and two sub-pixels at both ends of the second type light emitting unit 200 are connected in series with two driving sub-pixels in the second typed light emitting unit 200. Thus, an intensity of a driving signal of one pixel group can be borne by the sub-pixels on both sides, thereby reducing strength requirement of the driving signal.

Furthermore, in an embodiment of the present application, the plurality of second typed sub-pixels in the second typed light emitting unit 200 are independently driven.

The second typed light emitting unit 200 can include a plurality of second type of sub-pixels. The second typed sub-pixels are driven independently. Specifically, for example, the second typed light emitting unit 200 includes a red sub-pixel, a green sub-pixel, and a blue sub-pixel. An active matrix organic light emitting diode (AMOLED) is a display technology in which an organic light emitting diode (OLED) is deposited or integrated on a TFT array pixel, and strength of current flowing to each OLED pixel is controlled by the TFT array so as to determine an illumination strength of each pixel. The display screen in the embodiment of the present application can be prepared by using AMOLED technology. A specific preparation method thereof can be referred to the method of the afore-mentioned organic light emitting display device. The red sub-pixels are independently driven by one unit in the corresponding TFT array.

Furthermore, in an embodiment of the present application, the display screen is provided with a compensation circuit 300.

The compensation circuit 300 is electrically connected to the first typed light emitting unit 100 and/or the second typed light emitting unit 200 for balancing a brightness difference between the first typed light emitting unit 100 and the second typed light emitting unit 200.

The compensation circuit 300 can be disposed on both sides of any pixel group of the first typed light emitting unit 100, and the compensation circuit 300 is respectively connected in series with sub-pixels at both ends of any pixel group to input a driving signal to the pixel group so as to enhance the drive signal of the pixel group.

Furthermore, the compensation circuit 300 can also be located outside the driving sub-pixel of the second typed light-emitting unit 200, and be connected in series with the driving sub-pixel to further enhance the driving signal of the first typed light emitting unit 100.

It can be seen from the forgoing embodiments that a pixel group in the first typed light emitting unit 100 corresponds to at least one driving sub-pixel in the second typed light emitting unit 200, that is, one driving sub-pixel can drive a plurality of sub-pixels simultaneously. While the second typed light emitting unit 200 is independently driven, that is, the second typed light emitting unit 200 drives one sub-pixel at a time. The same driving signal has different performances when driving the first typed light emitting unit 100 and the second typed light emitting unit 200. At this time, the compensation circuit 300 can be provided, so that a sub-pixel in one pixel group of the first typed light emitting unit 100 and a sub-pixel of the second typed light emitting unit 200 have the same performances when driven by the same driving signal.

Specifically, the compensation circuit 300 is an extended driving circuit.

The present application is not limited to the method of using the compensation circuit 300 to balance the brightness difference, and can be other methods, such as using a special UI design of the terminal to balance the brightness difference.

Furthermore, in an embodiment of the present application, a display device is further provided, which includes a display screen and an under-screen light-sensitive module.

The display screen includes a first region and a second region. A first typed light emitting unit 100 is disposed in the first region, and a second typed light emitting unit 200 different from the first typed light emitting unit 100 is disposed in the second region. A driving array of the first typed light emitting unit 100 is deviated from the first region, and a driving array of the second typed light emitting unit 200 is located in the second region.

The under-screen photosensitive module can sense light that is incident through the display screen.

The display screen, the first region, and the second region have been described in detail in the forgoing embodiments, and will not be described in detail again.

In a specific application of the present application, the under-screen photosensitive module can be a camera or a photoelectric sensor. The photoelectric sensor can specifically be an infrared sensor for measuring whether a human face is close to the display screen.

The display device herein can be explained as an independent product, such as a mobile phone, a tablet computer or the like. The display device can also include a DC power supply, a DC power supply or AC power supply interface, a memory, a processor, and the like.

The DC power supply herein can be a lithium battery in a specific application. The DC power supply or AC power interface can be a micro-USB plug interface in a specific application. The memory can be a flash chip. The processor can be a CPU with a computing function, a single chip microcomputer, or the like.

Furthermore, in an embodiment of the present application, the under-screen photosensitive module is at least one of a photoelectric sensor and a camera.

The under-screen photosensitive module can be set as needed. The under-photosensitive module can specifically be at least one of a photoelectric sensor and a camera.

Furthermore, in an embodiment of the present application, the under-screen photosensitive module is embedded in the display screen by 4 mm to 6 mm.

In the display screen, as a depth of light propagation becomes larger, the illumination intensity thereof is attenuated. When the under-screen photosensitive module is embedded in the display screen by a depth of 4 mm to 6 mm, it can not only ensure a stable assembly of the under-screen photosensitive module, but also ensure that the light intensity is within the required range.

The technical features of the above embodiments can be arbitrarily combined. For the sake of brevity of description, all possible combinations of the technical features in the above embodiments are not described. However, as long as there is no collision in the combination of these technical features, it should be considered as the scope described in this specification.

The foregoing implementations are merely specific embodiments of the present disclosure, and are not intended to limit the protection scope of the present disclosure. It should be noted that any variation or replacement readily figured out by persons skilled in the art within the technical scope disclosed in the present disclosure shall all fall into the protection scope of the present disclosure. Therefore, the protection scope of the present disclosure shall be subject to the protection scope of the claims.

The invention claimed is:

1. A display screen comprising:
a display area comprising at least two display regions, the at least two display regions comprising a first display region having a first plurality of metal layers and a second display region having a second plurality of metal layers, wherein a total thickness of the first plurality of metal layers is less than or equal to 10 to 80 percent of a total thickness of the second plurality of metal layers.

2. The display screen according to claim 1 further comprising a first end and a second end configured opposite to the first end, the first display region being disposed at the first end of the display screen, the second display region being connected to the first display region and located at the second end of the display screen.

3. The display screen according to claim 1, wherein a thickness of each of the first plurality of metal layers is less than 10 to 80 percent of a thickness of a layer of the second plurality of metal layers.

4. The display screen according to claim 3, wherein a surface of each of the first plurality of metal layers and the second plurality of metal layers is respectively provided with a transparent flat layer; and a sum of thicknesses of the first plurality of metal layers and thicknesses of the flat layers in the first display region is equal to a sum of thicknesses of the second plurality of metal layers and thicknesses of the flat layers in the second display region.

5. The display screen according to claim 1 further comprising:
a substrate;
a screen circuit layer formed on the substrate, the screen circuit layer comprising a first portion and a second portion formed on the first portion;
a power transistor layer disposed on the screen circuit layer, the second portion of the screen circuit layer being coupled to the power transistor layer;
an insulating layer disposed at a portion of the screen circuit layer uncoupled with the power transistor layer; and
a light emitting module disposed on the power transistor layer, the light emitting module comprising an anode, a hole layer disposed on the anode, a light emitting layer disposed on the hole layer, an electron layer disposed on the light emitting layer, and a cathode layer disposed on the electron layer; the cathode layer extending from the electron layer to the insulating layer and continuously extending at an end of the insulating layer to be coupled to an external circuit;
wherein the metal layers comprise the screen circuit layer, the anode, and the cathode layer.

6. The display screen according to claim 5, further comprising:
a conductive layer and a first typed light emitting unit formed on the conductive layer, wherein, the first typed light emitting unit comprises a pixel region and electrochromic light transmittance material around the pixel region.

7. The display screen according to claim 6, further comprising: a second typed light emitting unit, the second typed light emitting unit comprising a pixel region and a pixel defining layer formed around the pixel region, the pixel defining layer containing no electrochromic light transmittance material; a plurality of the first typed light emitting units being integrated into the first display region, and a plurality of second typed light emitting units being integrated into the second display region.

8. The display screen according to claim 6, wherein the electrochromic light transmittance material is one of polyaniline, polythiophene, and polythiophene derivative, and the polythiophene derivative is 1,3-dimethyl polythiophene or 1,4-p-dimethyl polythiophene.

9. The display screen according to claim 7, wherein the electrochromic light transmittance material is disposed in the pixel defining layer, penetrating the pixel defining layer and contacting with the conductive layer.

10. The display screen according to claim 7, wherein the electrochromic light transmittance material forms a strip, and a ratio of a width of the strip to a width of the pixel defining layer ranges from 1:2 to 3:4.

11. The display screen according to claim 10, wherein the width of the strip ranges from 4 μm to 10 μm.

12. The display screen according to claim 5, wherein the screen circuit layer is provided with a pixel circuit and a driving circuit; the pixel circuit is distributed over the entire display area of the display screen; and the driving circuit is located below the pixel circuit and is disposed at both sides of the second display region.

13. The display screen according to claim 5, wherein the second portion of the screen circuit layer is provided with a recess; and the insulating layer is further filled in the recess.

14. The display screen according to claim 12, further comprising an instantaneous blackening circuit, the instantaneous blackening circuit being connected to the pixel circuit of the first display region; and the instantaneous blackening circuit being configured to receive a control signal and control each pixel in the first display region to be in a non-display state when receiving the control signal.

15. A terminal comprising:
a body; and
a display screen disposed on the body;
the body being configured to implement a target function of the terminal;

the display screen comprising a display area, the display area comprising at least two display regions, the at least two display regions comprising a first display region having a plurality of first metal layers and a second display region having a plurality of second metal layers, wherein a total thickness of the first plurality of metal layers is less than or equal to 10 to 80 percent of a total thickness of the second plurality of metal layers; and the body comprising a controller and a front device; the front device being disposed under the first display region of the display screen; the controller controlling the first display region and the second display region independently; and the controller being further configured to control the first display region to be in an unlit state when the front device is in operation.

16. The terminal according to claim 15, wherein the controller comprises a partition control module; the partition control module is configured to receive an operating signal of the front device and generate a control signal for the first display region when receiving the operating signal; and the control signal is configured to control each pixel of the first display region to be in a non-display state.

17. The terminal according to claim 16, wherein the first display region comprises a pixel circuit, the pixel circuit of the first display region is an N-type circuit, and the control signal is a low-level signal; or the pixel circuit of the first display region is a P-type circuit, and the control signal is a high-level signal.

18. The terminal according to claim 15, further comprising an under-screen photosensitive module, and the under-screen photosensitive module being at least one of a photoelectric sensor and a camera.

19. A display screen, comprising:
a display area comprising at least two display regions, wherein the at least two display regions comprises a first display region and a second display region, a thickness of the first display region being less than or equal to a thickness corresponding to the first display region in a transparent state during an unlit state;
a plurality of metal layers, wherein each of the plurality of metal layers has a first thickness in the first display region and a second thickness greater than the first thickness in the second display region; and
a plurality of flat layers, wherein each of the plurality of flat layers is formed on one of the plurality of metal layers, and wherein each of the plurality of flat layers has a third thickness in the first display region that equals a difference between the first thickness and the second thickness.

* * * * *